(12) United States Patent
Adler et al.

(10) Patent No.: US 8,455,963 B1
(45) Date of Patent: Jun. 4, 2013

(54) LOW FREQUENCY CMUT WITH VENT HOLES

(75) Inventors: Steven Adler, Saratoga, CA (US); Peter Johnson, Sunnyvale, CA (US); Ira Oaktree Wygant, Palo Alto, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/309,773

(22) Filed: Dec. 2, 2011

(51) Int. Cl.
*H01L 29/84* (2006.01)
*H02K 41/02* (2006.01)
*A61B 8/00* (2006.01)

(52) U.S. Cl.
USPC ............ 257/416; 257/E27.016; 310/12.03; 600/437

(58) Field of Classification Search
CPC .... H04R 19/005; H01R 19/04; H02K 41/0354; A61B 8/00; A61B 6/463; B81B 2201/0257; G11B 5/5552
USPC ....... 257/415, 416, 595, E27, 16; 310/12.03; 310/311; 600/300, 407, 437
See application file for complete search history.

(56) References Cited

U.S. PATENT DOCUMENTS

| 6,140,689 | A  | * | 10/2000 | Scheiter et al. | ............... 257/414 |
| 6,287,885 | B1 | * | 9/2001  | Muto et al.     | ...................... 438/48 |
| 7,825,484 | B2 | * | 11/2010 | Martin et al.   | ................. 257/415 |
| 2009/0029501 | A1 | * | 1/2009 | Weigold         | ......................... 438/53 |

* cited by examiner

*Primary Examiner* — Nikolay Yushin
(74) *Attorney, Agent, or Firm* — Eugene C. Conser; Wade J. Brady, III; Frederick J. Telecky, Jr.

(57) ABSTRACT

A capacitive micromachined ultrasonic transducer (CMUT), which has a conductive structure that can vibrate over a cavity, has a number of vent holes that are formed in the bottom surface of the cavity. The vent holes eliminate the deflection of the CMUT membrane due to atmospheric pressure which, in turn, allows the CMUT to receive and transmit low frequency ultrasonic waves.

5 Claims, 24 Drawing Sheets

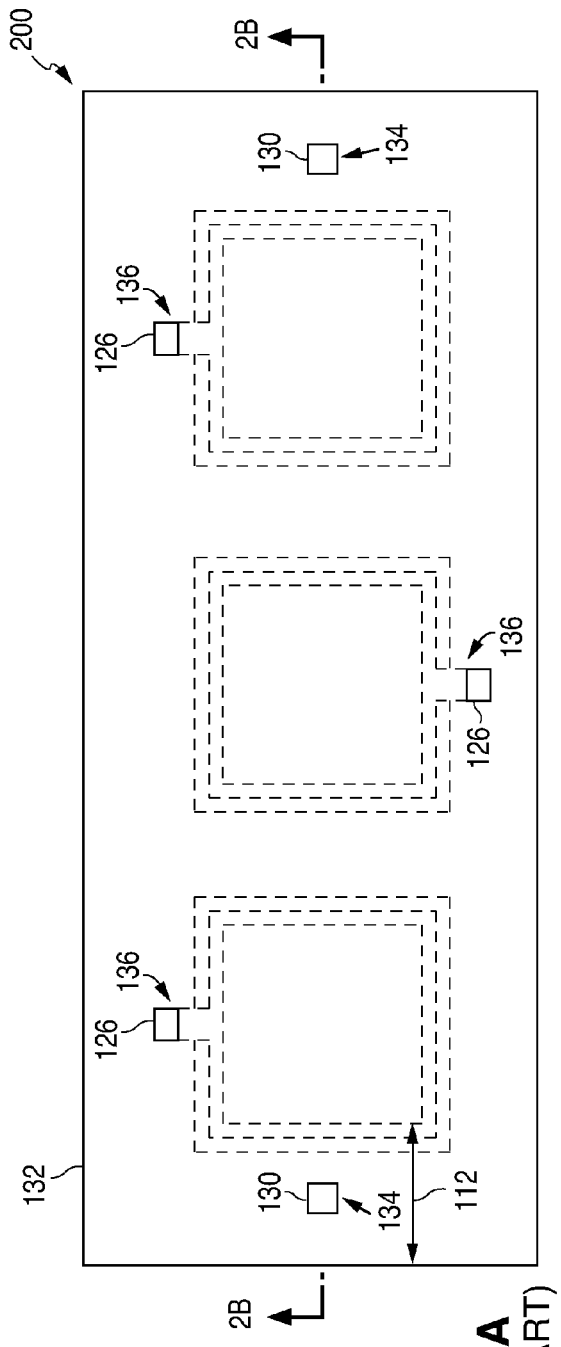
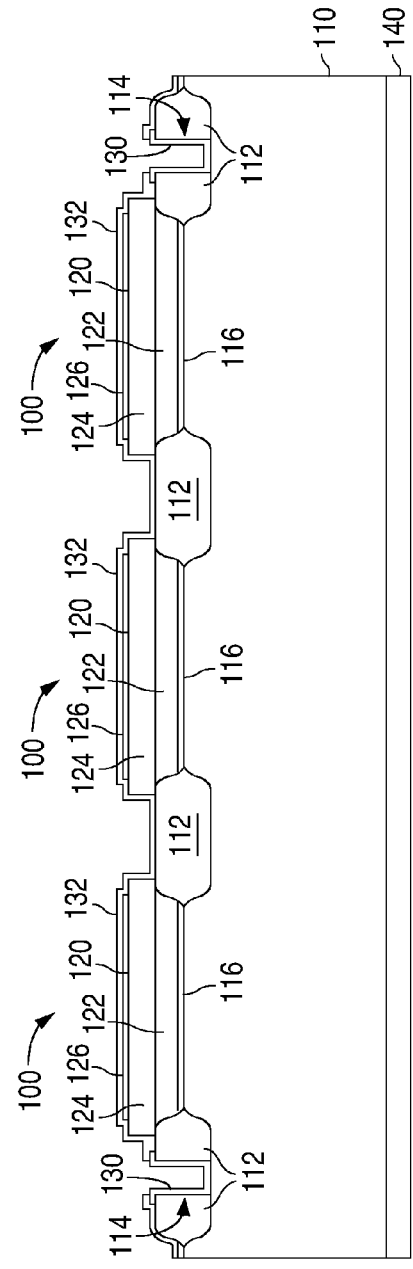
FIG. 2A (PRIOR ART)
FIG. 2B (PRIOR ART)

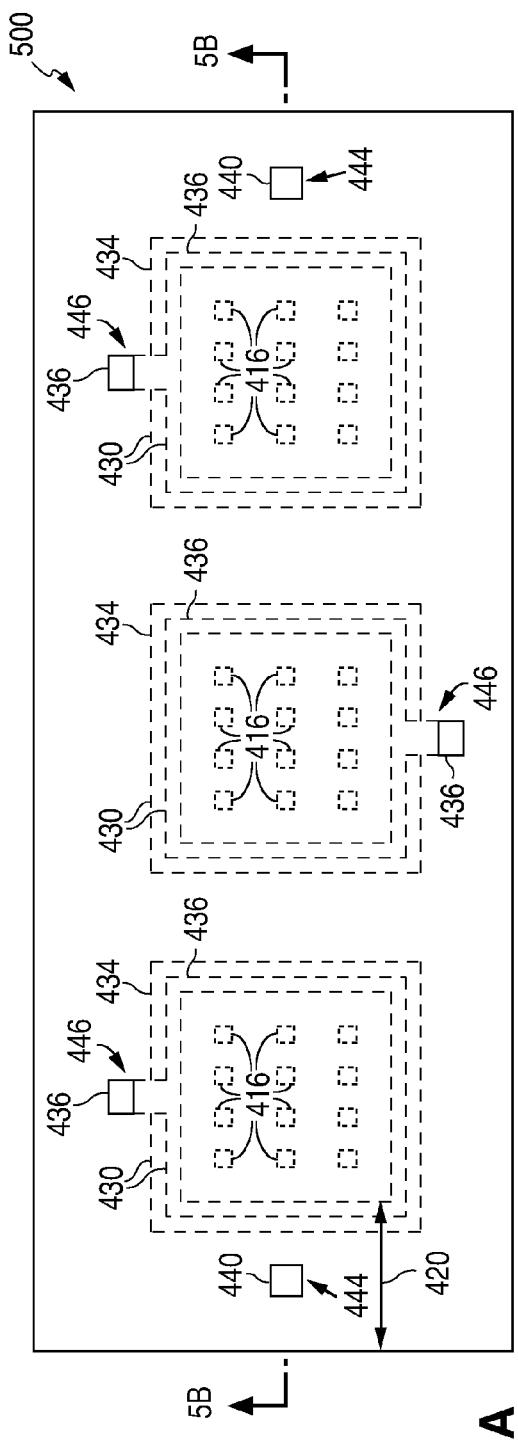
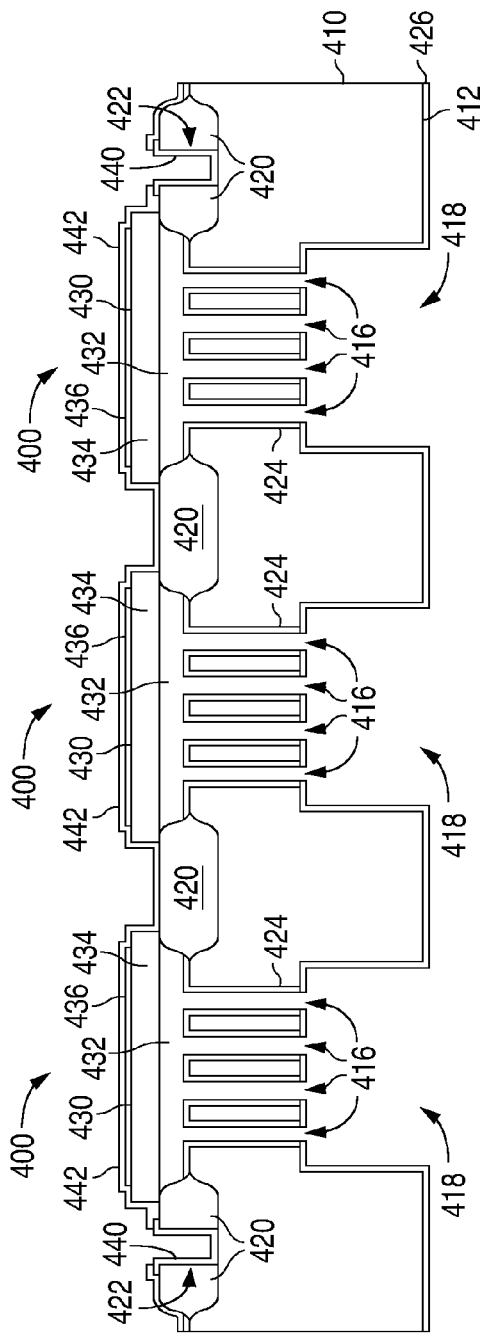
FIG. 5A
FIG. 5B

LOW FREQUENCY CMUT WITH VENT HOLES

BACKGROUND OF THE INVENTION

1. Field of the Invention

The present invention relates to CMUTS and, more particularly, to a low frequency CMUT with vent holes.

2. Description of the Related Art

A capacitive micromachined ultrasonic transducer (CMUT) is a semiconductor-based ultrasonic transducer that utilizes a change in capacitance to convert received ultrasonic waves into an electrical signal, and to convert an alternating electrical signal into transmitted ultrasonic waves.

FIGS. 1A-1B show views that illustrate an example of a prior-art CMUT 100. FIG. 1A shows a plan view of CMUT 100, while FIG. 1B shows a cross-sectional view taken along line 1B-1B of FIG. 1A. As shown in FIGS. 1A-1B, CMUT 100 includes a conventionally-formed semiconductor substrate 110, and a post oxide structure 112 that touches the top surface of semiconductor substrate 110. Post oxide structure 112, in turn, has substrate contact openings 114 that extend completely through post oxide structure 112 to expose semiconductor substrate 110.

As further shown in FIGS. 1A-1B, CMUT 100 includes a non-conductive structure 116 that touches the top surface of semiconductor substrate 110, and a conductive structure 120 that touches the top surface of post oxide structure 112 over non-conductive structure 116 to form a vacuum-sealed cavity 122. In the present example, conductive structure 120 includes a semiconductor structure 124 such as, for example, single crystal silicon, and an overlying metal structure 126, such as an aluminum copper plate.

In addition, CMUT 100 includes substrate bond pads 130 that lie within the substrate contact openings 114 to make electrical connections to semiconductor substrate 110, and a passivation layer 132 that touches and lies over post oxide structure 112, conductive structure 120, and the substrate bond pads 130. Passivation layer 132 has substrate bond pad openings 134 that expose the substrate bond pads 130, and a conductor opening 136 that exposes a region of conductive structure 120 which functions as a bond pad. Further, CMUT 100 has an acoustic dampening structure 140 that touches the bottom surface of semiconductor substrate 110.

In operation, a first bias voltage V1 is placed on semiconductor substrate 110, which functions as a first capacitor plate, and a second bias voltage V2 is placed on conductive structure 120, which functions as second capacitor plate. Thus, the voltage across the capacitor plates lies across vacuum-sealed cavity 122. When used as a receiver, an ultrasonic wave causes conductive structure 120 to vibrate. The vibration varies the capacitance across the first and second capacitor plates, thereby generating an electrical signal that varies as the capacitance varies.

When used as a transmitter, an alternating electrical signal applied across the biased first and second capacitor plates causes conductive structure 120 to vibrate which, in turn, transmits ultrasonic waves. The rate or frequency at which conductive structure 120 vibrates depends on the volume of vacuum-sealed cavity 122, and the stiffness of conductive structure 120.

In addition to transmitting ultrasonic waves outward, ultrasonic waves are also transmitted backward towards the bottom surface of semiconductor substrate 110. These backward ultrasonic waves can resonate within semiconductor substrate 110 depending on the thickness of semiconductor substrate 110 and the frequency of operation, and can interfere with the quality of the resultant image. Acoustic dampening structure 140 absorbs and dampens the ultrasonic waves in semiconductor substrate 110.

FIGS. 2A-2B show views that illustrate an example of a prior-art CMUT array 200. FIG. 2A shows a plan view of array 200, while FIG. 2B shows a cross-sectional view taken along line 2B-2B of FIG. 2A. As shown in the FIGS. 2A-2B example, CMUT array 200 includes three CMUTS 100 in a single row.

FIGS. 3A-3N show cross-sectional views that illustrate an example of a prior-art method of forming a CMUT. As shown in FIG. 3A, the method utilizes a conventionally-formed single-crystal silicon wafer 310. Silicon wafer 310 has rows and columns of die-sized regions, and one or more CMUTS can be simultaneously formed in each die-sized region. For simplicity, FIGS. 3A-3N illustrate the formation of a single CMUT.

As further shown in FIG. 3A, the method begins by forming a post oxide structure 312 on the top surface of silicon wafer 310 using the well-known local oxidation of silicon (LOCOS) process. The LOCOS process also forms a backside oxide structure 314 at the same time. Following this, as shown in FIG. 3B, a cell oxide layer 316 is grown on the exposed regions of the top surface of silicon wafer 310.

After cell oxide layer 316 has been formed, as shown in FIG. 3C, a silicon-on-oxide (SOI) wafer 320 is fusion bonded to the top surface of post oxide structure 312 to form a cavity 322. SOI wafer 320 has a handle wafer 324, an insulation layer 326 that touches handle wafer 324, and a single-crystal silicon substrate structure 328. Substrate structure 328, in turn, has a first surface that touches insulation layer 326, and a second surface that touches post oxide structure 312.

Cavity 322, in turn, has a depth that is measured vertically from the top surface of cell oxide layer 316 to the second surface of substrate structure 328. The thickness of cell oxide layer 316 defines the position of the top surface of cell oxide layer 316. In addition, the height of post oxide structure 312 over the top surface of silicon wafer 310 defines the position of the second surface of substrate structure 328.

The thickness of cell oxide layer 316 is relatively small compared to the height of post oxide structure 312 over the top surface of silicon wafer 310. As a result, the depth of cavity 322 is substantially defined by the height of post oxide structure 312 over the top surface of silicon wafer 310. In addition, substrate structure 328 of SOI wafer 320 is fusion bonded to the top surface of post oxide structure 312 of silicon wafer 310 in a vacuum to vacuum seal cavity 322.

After substrate structure 328 has been fusion bonded to post oxide structure 312, as shown in FIG. 3D, handle wafer 324 is removed in a conventional manner, followed by the conventional removal of insulation layer 326. Next, as shown in FIG. 3E, a patterned photoresist layer 330 is formed on the first surface of substrate structure 328. Once patterned photoresist layer 330 has been formed, as shown in FIG. 3F, the exposed region of substrate structure 328 is etched to form a CMUT membrane 332. Patterned photoresist layer 330 is then removed in a conventional manner.

As shown in FIG. 3G, after the removal of photoresist layer 330, a patterned photoresist layer 340 is formed on post oxide structure 312 and CMUT membrane 332. Once patterned photoresist layer 340 has been formed, as shown in FIG. 3H, the exposed regions of post oxide structure 312 are etched until silicon wafer 310 has been exposed. Patterned photoresist layer 340 is then removed in a conventional manner.

Following the removal of photoresist layer 340, as shown in FIG. 3I, a metal layer 342, such as a layer of aluminum copper, is deposited to touch silicon wafer 310, post oxide structure 312, and CMUT membrane 332. After this, a patterned photoresist layer 350 is formed on metal layer 342.

Next, as shown in FIG. 3J, the exposed region of metal layer 342 is etched to form semiconductor bond pads 352 that extend through post oxide structure 312 to touch silicon wafer 310, and a metal plate 354 that touches the top surface of CMUT membrane 332. Patterned photoresist layer 350 is then removed in a conventional manner.

As shown in FIG. 3K, after patterned photoresist layer 350 has been removed, a passivation layer 356 is formed to touch post oxide structure 312, CMUT membrane 332, the bond pads 352, and metal plate 354. Once passivation layer 356 has been formed, a patterned photoresist layer 360 is formed on passivation layer 356.

After this, as shown in FIG. 3L, the exposed regions of passivation layer 356 are etched to form openings that expose the semiconductor bond pads 352, and an opening, like opening 136 in FIG. 1A, that exposes a bond pad region of metal plate 354. As shown in FIG. 3M, patterned photoresist layer 360 is then removed in a conventional manner.

Next, the resulting structure is flipped over for processing, and backside oxide structure 314 is removed in a conventional manner. For example, backside oxide structure 314 can be removed using chemical mechanical polishing. Alternately, backside oxide structure 314 can be removed using a single-sided wet etch, such as a SEZ etch.

Following the removal of backside oxide structure 314, an acoustic damping structure 362, such as a tungsten epoxy mixture, is deposited onto the bottom side of silicon wafer 310 to form, as shown in FIG. 3N, a CMUT 364. Silicon wafer 310 is then diced to form a number of individual die that each has one or more CMUTS 364.

In the present example, cavity 322 has a depth of approximately 0.2 µm and a diameter of approximately 36.0 µm. In addition, CMUT membrane 332, metal plate 354, and the overlying region of passivation layer 356 vibrate at frequencies of approximately 10-20 MHz. These frequencies are suitable for contact or near contact body imaging applications, like echo cardiograms, but are not suitable for airborne ultrasound applications where, for example, the object to be detected, such as the hand motions of a person playing a game, is one or more meters away.

Instead, airborne ultrasound applications require much lower frequencies, such as 100-200 KHz. If CMUT 364 were scaled up in size to operate at these lower frequencies, then CMUT 364 would require a larger cell diameter (e.g. increasing from about 36 µm to about 1 mm-2 mm), a thicker CMUT membrane 332 (e.g. increasing from 2 µm to 5 µm-40 µm), and a deeper cell cavity 322 (e.g. increasing from 0.2 µm to fpm-12 µm). A deeper cell cavity is required to accommodate the atmospheric deflection of CMUT membrane 332, which can be on the order of several microns. For proper CMUT operation CMUT membrane 332 should not touch the bottom surface of cavity 322, but rather be a fixed distance of one or more microns above the bottom surface of cavity 322.

Since the height of post oxide structure 312 substantially determines the depth of cavity 322, scaling up CMUT 364 requires that post oxide structure 312 have a height above the top surface of silicon wafer 310 of approximately 1 µm-12 µm, or a total thickness of 2 µm-24 µm. However, forming a post oxide structure with a thickness that exceeds approximately 5 µm (or heights that exceed 2.5 µm) is difficult to accomplish because the rate of oxide growth slows dramatically when the thickness of the post oxide structure approaches 5 µm.

As a result, it is difficult to scale up CMUT 364 to accommodate these lower frequencies. Thus, there is a need for an approach to forming low frequency CMUTS for airborne ultrasonic applications.

BRIEF DESCRIPTION OF THE DRAWINGS

FIG. 1A is a plan view of CMUT 100. FIG. 1B is a cross-sectional view taken along line 1B-1B of FIG. 1A.

FIGS. 2A-2B are views illustrating an example of a prior-art CMUT array 200. FIG. 2A is a plan view of array 200. FIG. 2B is a cross-sectional view taken along line 2B-2B of FIG. 2A.

FIG. 4A is a plan view of CMUT 400. FIG. 4B is a cross-sectional view taken along line 4B-4B of FIG. 4A.

FIGS. 5A-5B are views illustrating an example of a CMUT array 500 in accordance with the present invention. FIG. 5A is a plan view of array 500. FIG. 5B is a cross-sectional view taken along line 5B-5B of FIG. 5A.

FIG. 7A is a plan view of CMUT 700. FIG. 7B is a cross-sectional view taken along line 7B-7B of FIG. 7A.

FIG. 8A is a plan view of CMUT 800. FIG. 8B is a cross-sectional view taken along line 8B-8B of FIG. 8A.

FIG. 9A is a plan view of CMUT 900. FIG. 9B is a cross-sectional view taken along line 9B-9B of FIG. 9A.

DETAILED DESCRIPTION OF THE INVENTION

Figure 1A:
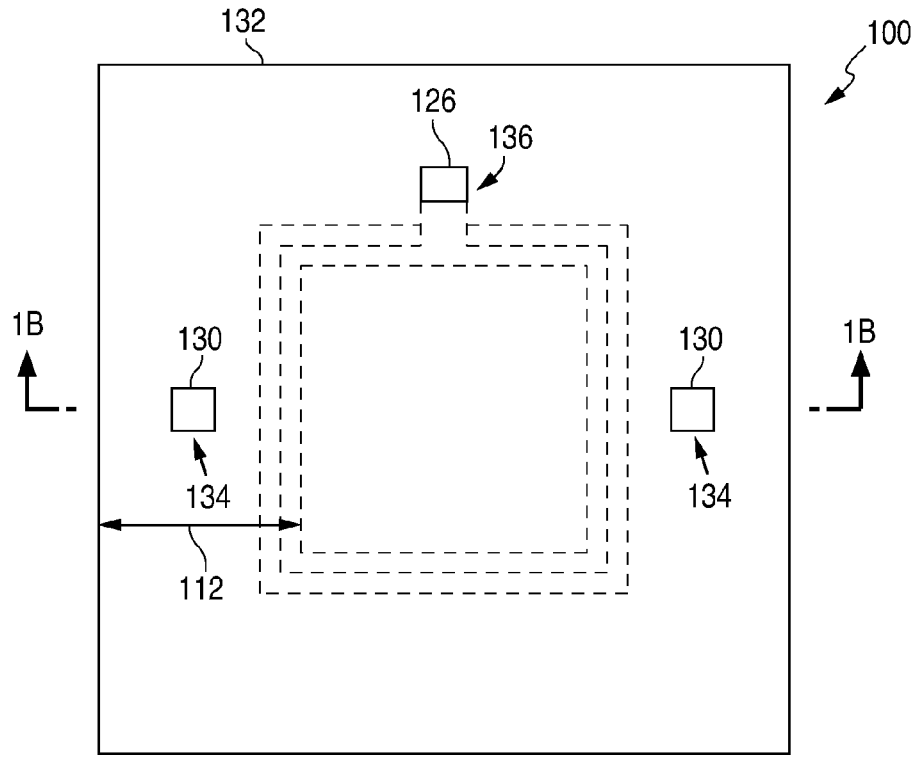
FIGS. 1A-1B are views illustrating an example of a prior-art CMUT 100.
Figure 1B:
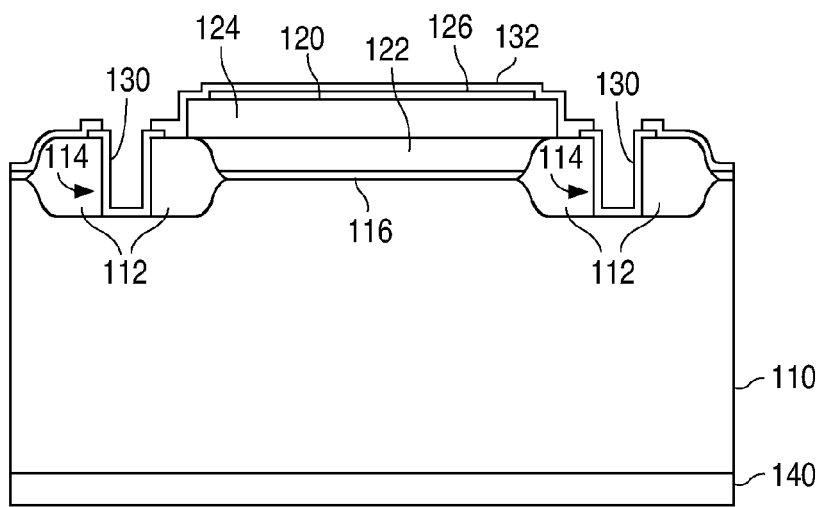
Figure 3A:
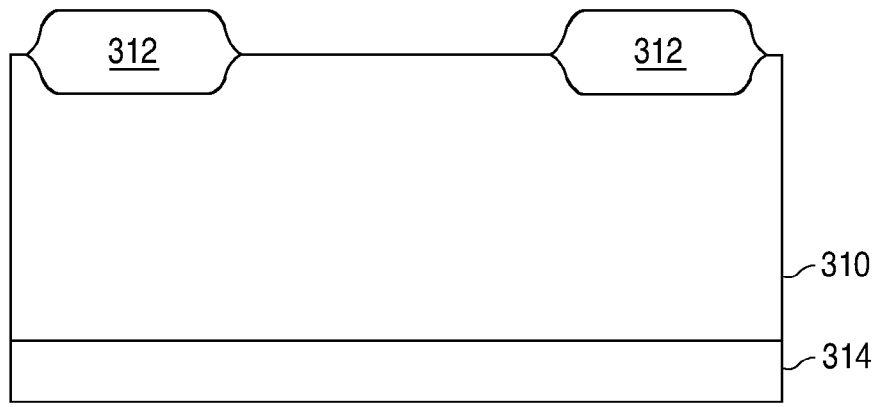
FIGS. 3A-3N are cross-sectional views illustrating an example of a prior-art method of forming a CMUT.
Figure 3B:
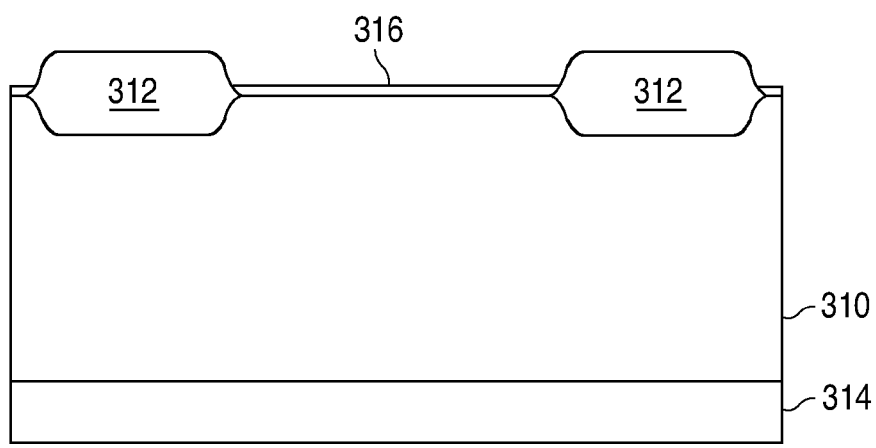
Figure 3C:
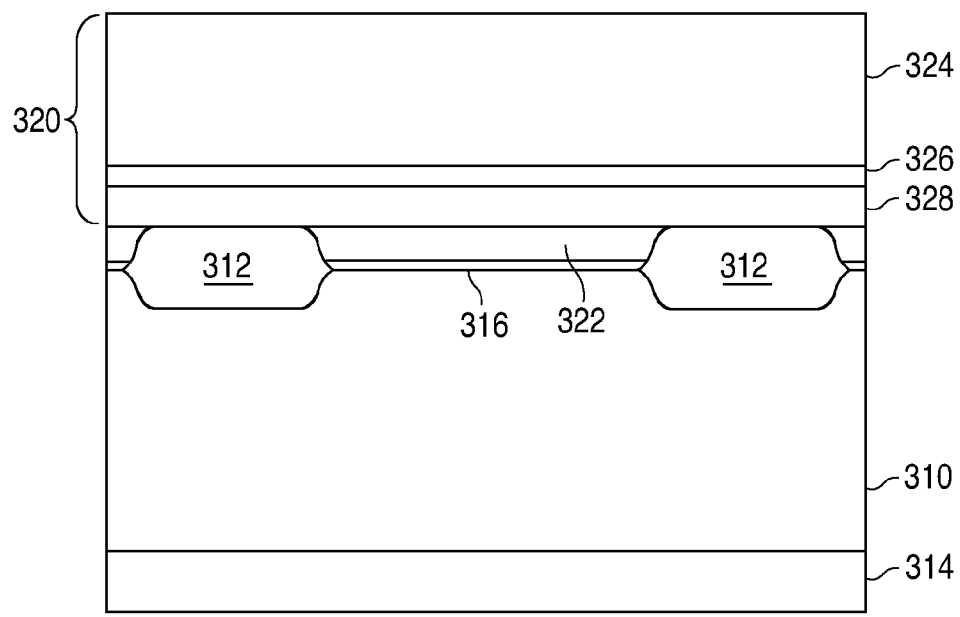
Figure 3D:
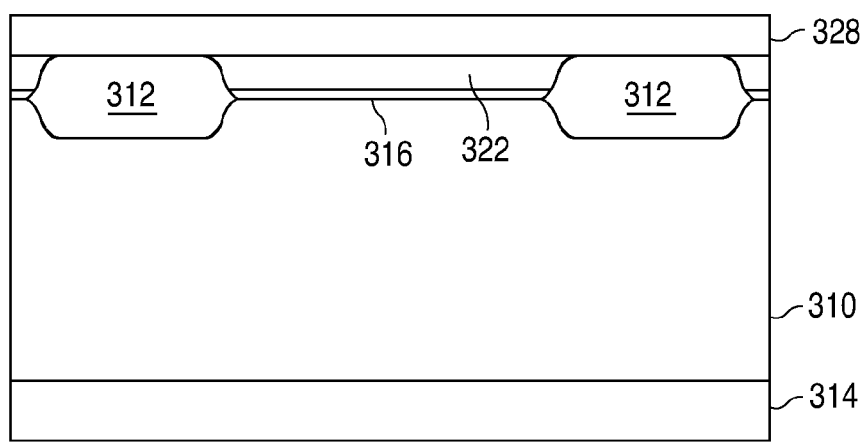
Figure 3E:
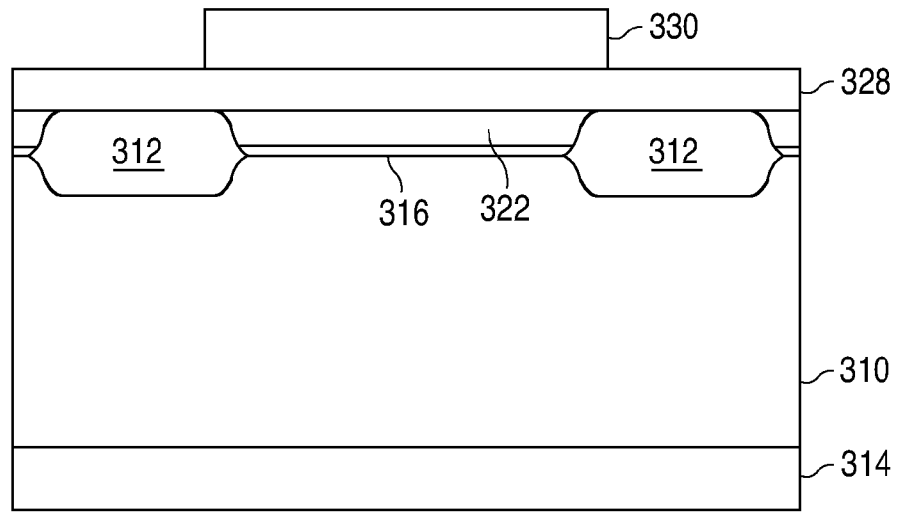
Figure 3F:
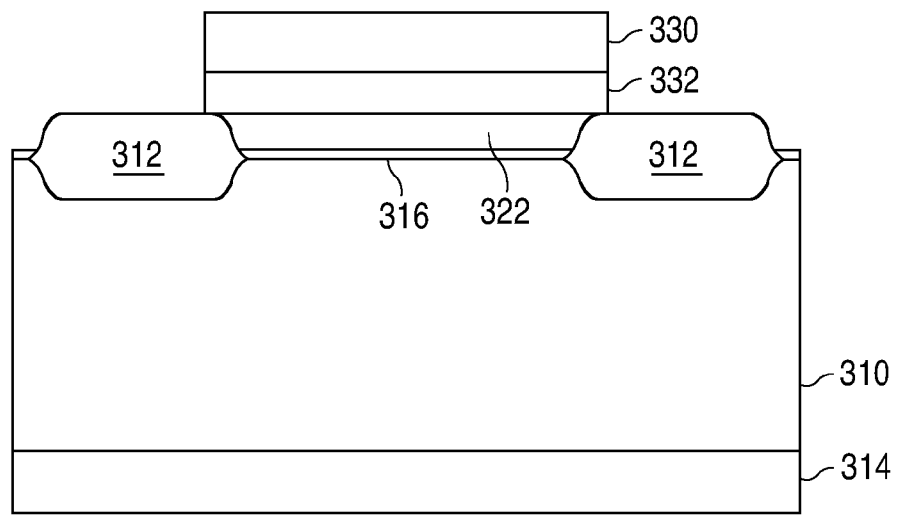
Figure 3G:
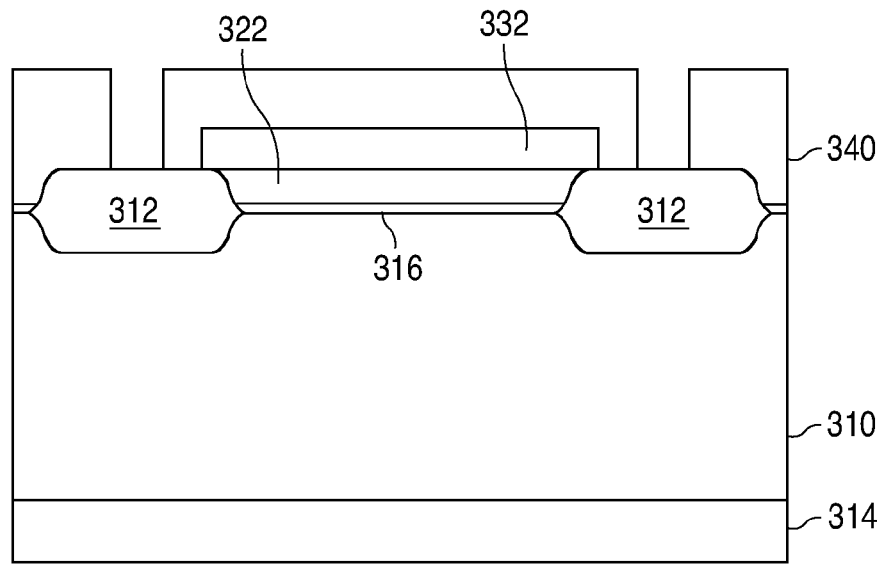
Figure 3H:
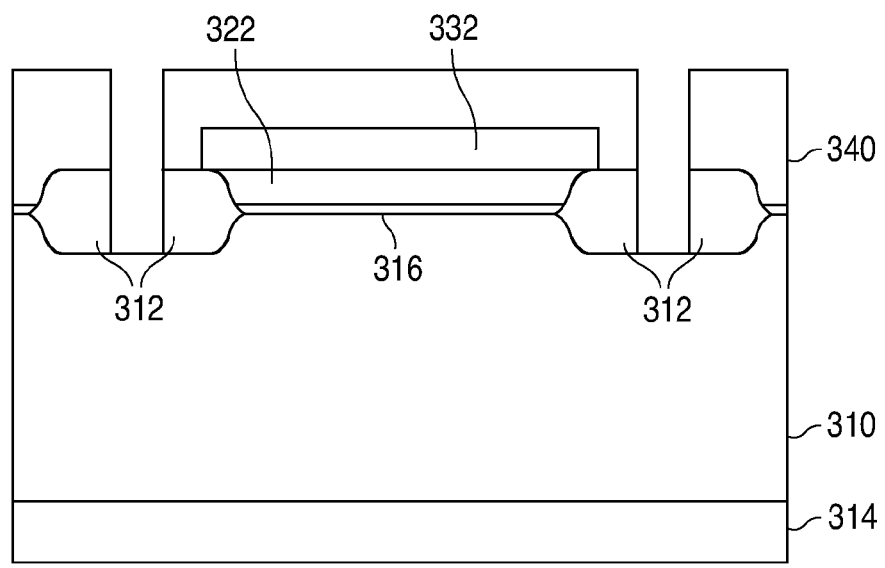
Figure 3I:
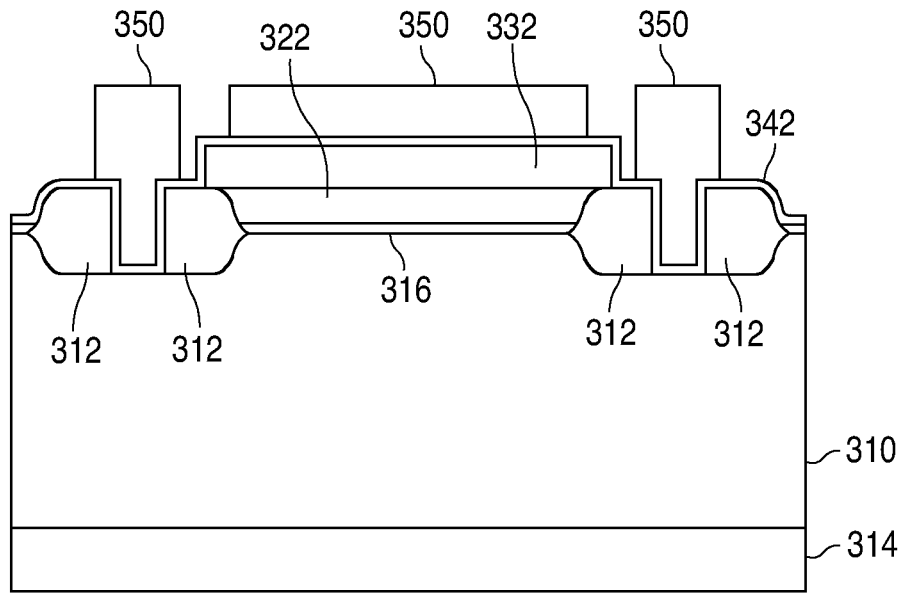
Figure 3J:
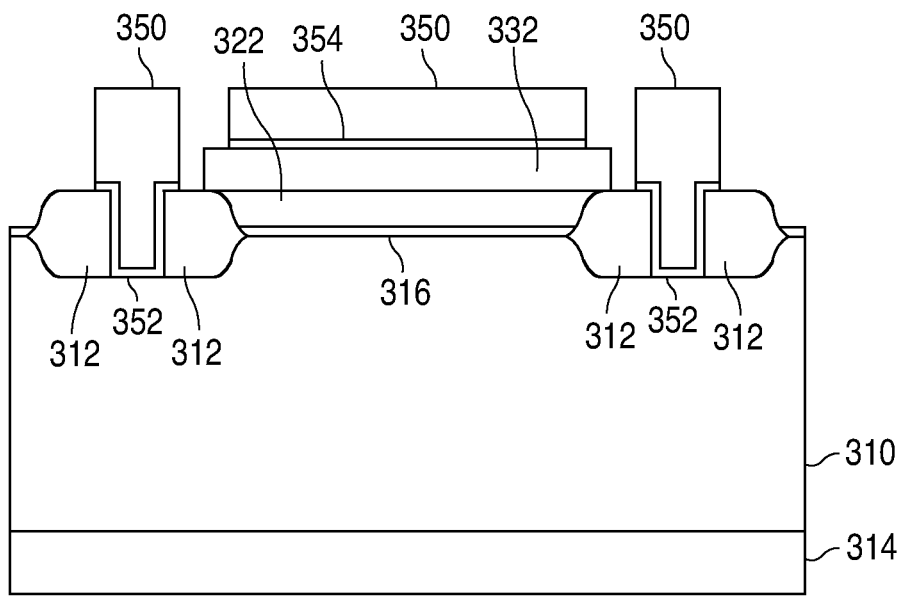
Figure 3K:
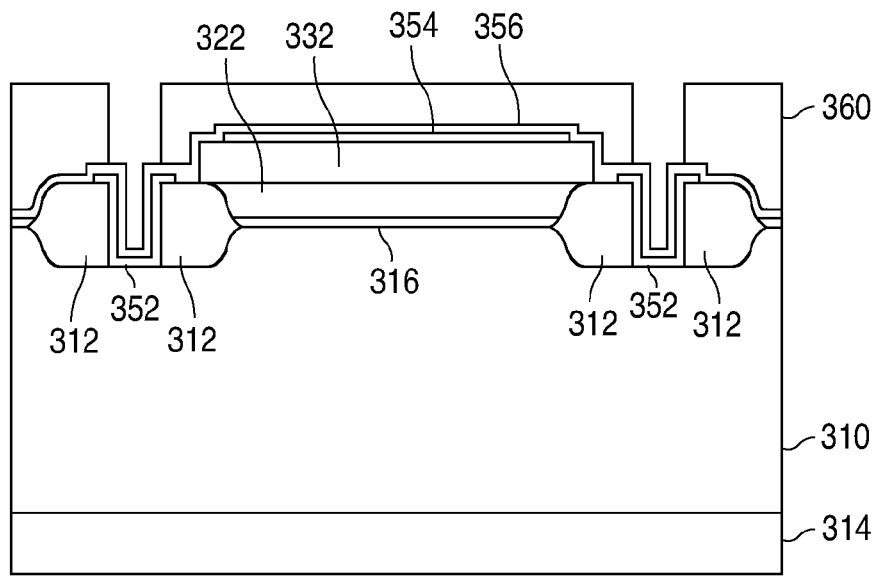
Figure 3L:
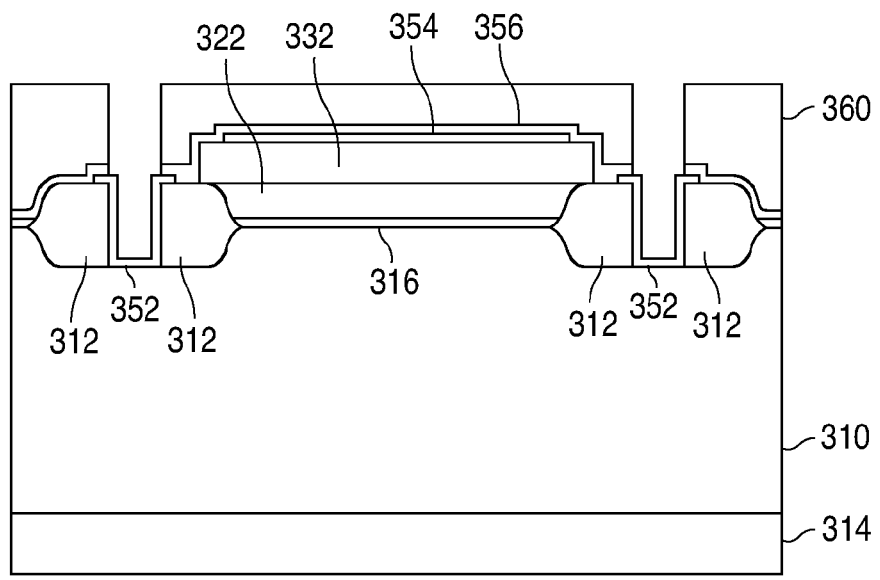
Figure 3M:
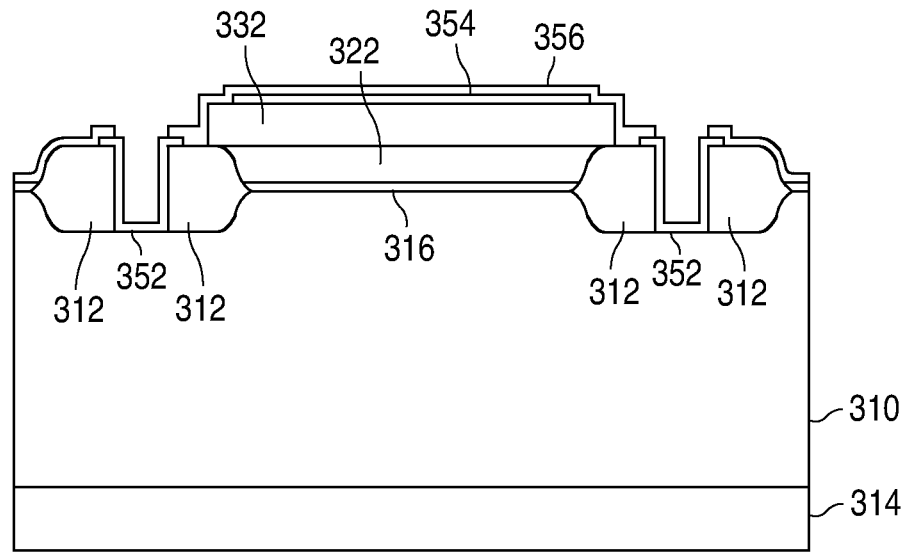
Figure 3N:
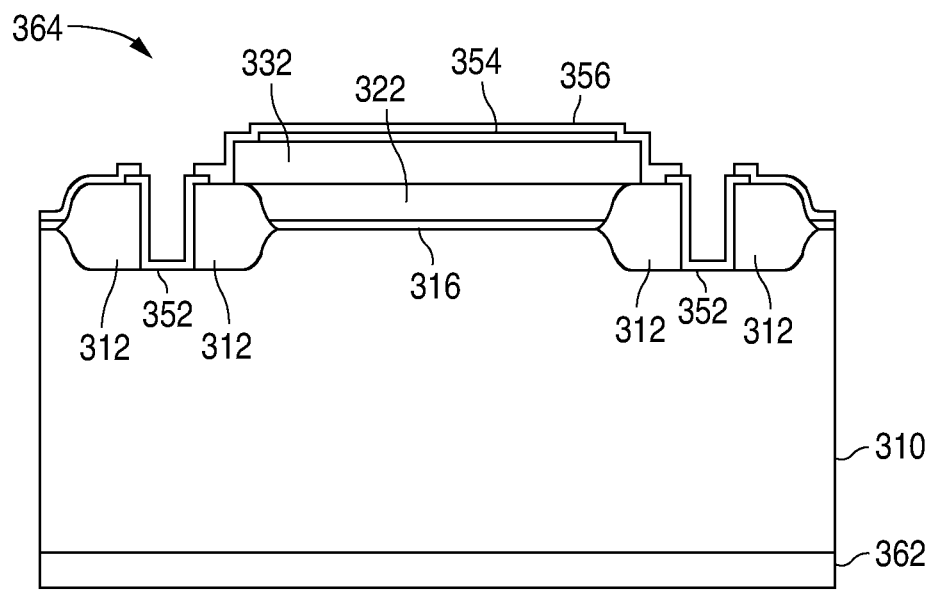
Figure 4A:
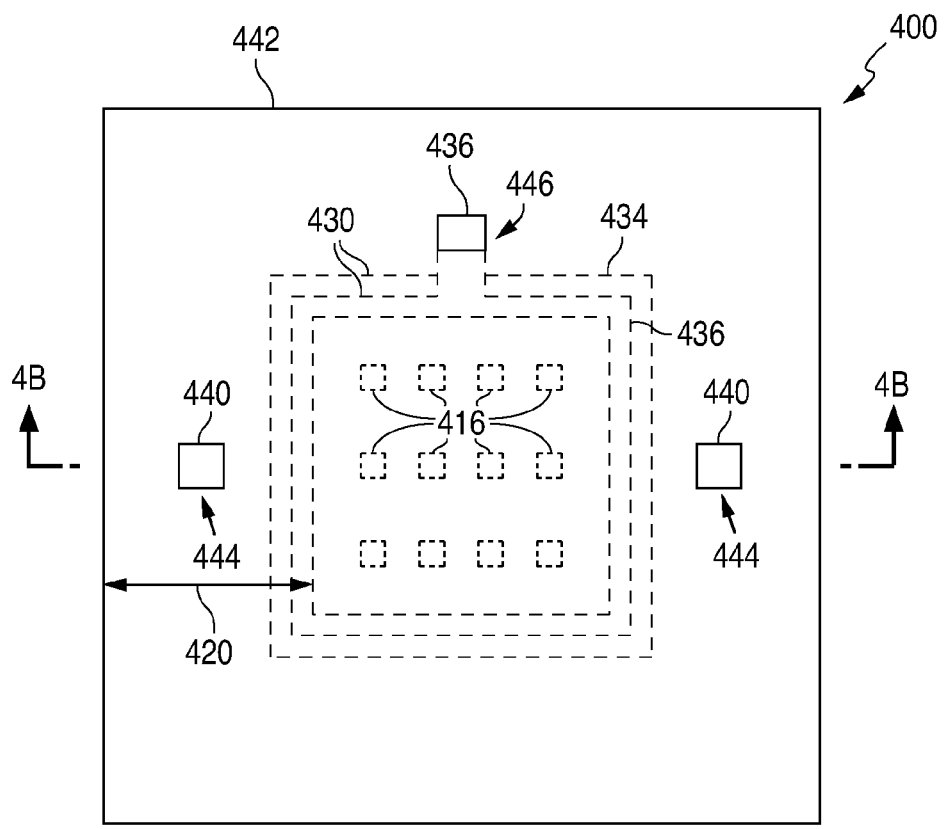
FIGS. 4A-4B are views illustrating an example of a CMUT 400 in accordance with the present invention.
Figure 4B:
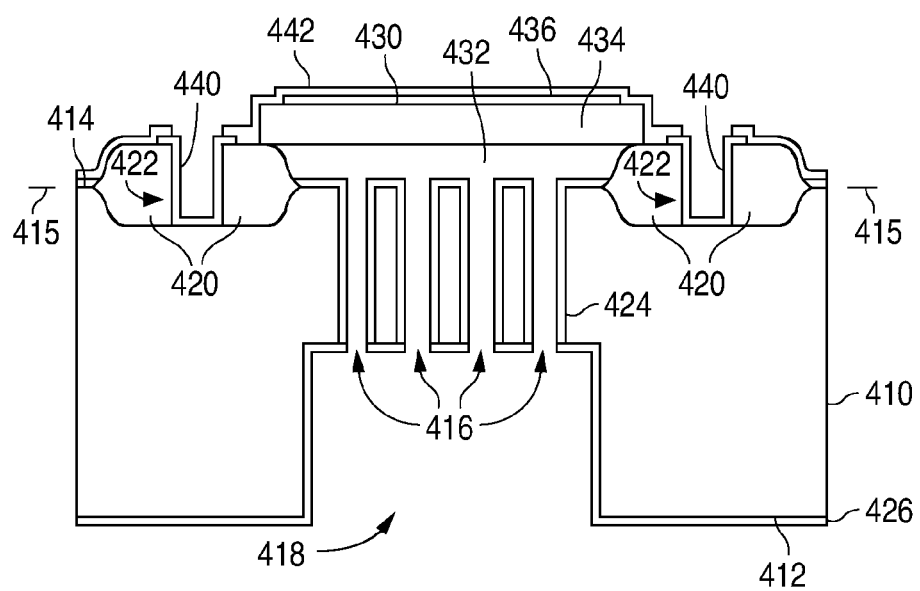

FIGS. 4A-4B show views that illustrate an example of a CMUT 400 in accordance with the present invention. FIG. 4A shows a plan view of CMUT 400, while FIG. 4B shows a cross-sectional view taken along line 4B-4B of FIG. 4A. As described in greater detail below, CMUT 400 utilizes vent holes that allow CMUT 400 to receive and transmit low frequency ultrasonic waves.

As shown in FIGS. 4A-4B, CMUT 400 includes a semiconductor substrate 410 that has a bottom surface 412 and a top surface 414, where the top surface 414 lies in a plane 415. Semiconductor substrate 410, which is conductive, can be implemented with, for example, single-crystal silicon.

In addition, semiconductor substrate 410 has a number of vent holes 416 that extend down from the top surface 412 into semiconductor substrate 410. Further, in the FIGS. 4A-4B example, semiconductor substrate 410 has a backside opening 418 that extends up from the bottom surface 414 into semiconductor substrate 410 to expose and open the vent holes 416.

In addition, CMUT 400 also includes a post oxide structure 420 that touches the top surface 414 of semiconductor substrate 410 and lies both above and below plane 415. Further, post oxide structure 420, which is non-conductive, laterally surrounds the vent holes 416. In the FIGS. 4A-4B example, post oxide structure 420 also has substrate contact openings 422 that extend completely through post oxide structure 420 to expose semiconductor substrate 410.

As further shown in FIGS. 4A-4B, CMUT 400 includes a non-conductive structure 424 that touches the top surface 414 of semiconductor substrate 410 and lines the vent holes 416 so that the vent holes remain open. In addition, non-conductive structure 424, which can be implemented with a layer of oxide, is laterally surrounded and touched by post oxide structure 420. CMUT 400 also includes a non-conductive structure 426 that touches the bottom surface 412 of semiconductor substrate 410 and lines backside opening 418 so that the vent holes remain open.

In addition, CMUT 400 includes a conductive structure 430 that touches the top surface of post oxide structure 420, and lies directly vertically over the vent holes 416 to form a cavity 432 that lies vertically between the top surface of non-conductive structure 424 and conductive structure 430 over the top ends of the vent holes 416. In the present example, conductive structure 430 includes a semiconductor structure 434 such as, for example, single crystal silicon, and an overlying metal structure 436, such as an aluminum copper plate.

CMUT 400 further includes substrate bond pads 440 that lie within the substrate contact openings 422 to make electrical connections to semiconductor substrate 410, and a passivation layer 442 that touches and lies over post oxide structure 420, conductive structure 430, and the substrate bond pads 440. Passivation layer 442, which is non-conductive, has substrate bond pad openings 444 that expose the substrate bond pads 440, and a conductive opening 446 that exposes a region of metal structure 436 that functions as a bond pad.

In operation, a first bias voltage V1 is placed on semiconductor substrate 410, which functions as a first capacitor plate, and a second bias voltage V2 is placed on conductive structure 430, which functions as second capacitor plate. Thus, the voltage across the capacitor plates lies vertically across cavity 432.

When used as a receiver, an ultrasonic wave causes conductive structure 430 to vibrate. The vibration varies the capacitance across the first and second capacitor plates, thereby generating an electrical signal that varies as the capacitance varies. When used as a transmitter, an alternating electrical signal applied across the biased first and second capacitor plates causes conductive structure 430 to vibrate which, in turn, transmits ultrasonic waves.

The primary advantage of CMUT 400 is that the vent holes 416 equilibrate the pressures on both sides of CMUT membrane 434, thereby eliminating the deflection due to atmospheric pressure. Without atmospheric deflection, cavity 432 does not need to be as deep. As a result, it is still possible to form cavity 432 using the LOCOS thermal oxidation method.

FIGS. 5A-5B show views that illustrate an example of a CMUT array 500 in accordance with the present invention. FIG. 5A shows a plan view of array 500, while FIG. 5B shows a cross-sectional view taken along line 5B-5B of FIG. 5A. As shown in the FIGS. 5A-5B example, CMUT array 500 includes three CMUTS 400 in a single row.

Figure 6A:
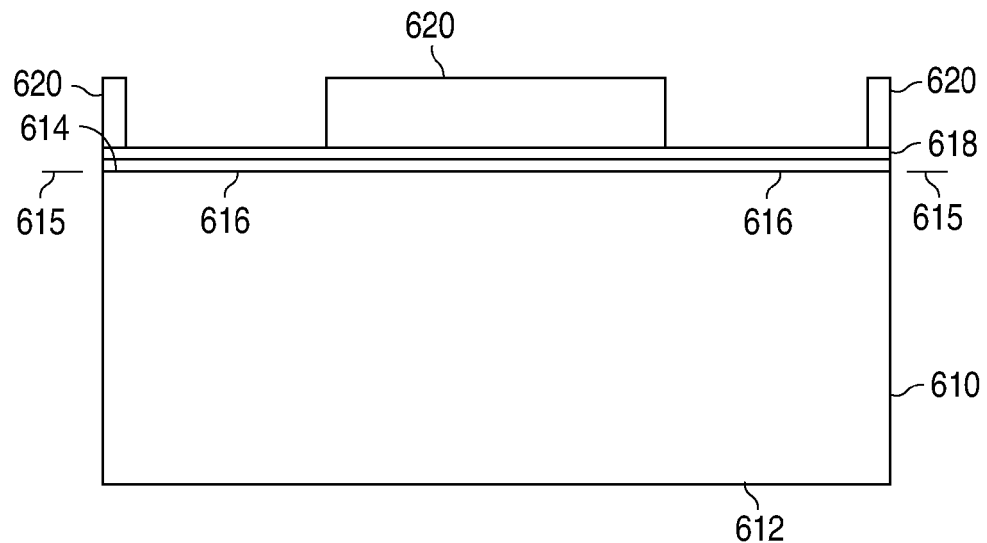
FIGS. 6A-6S are cross-sectional views illustrating an example of a method of forming a CMUT in accordance with the present invention.
Figure 6B:
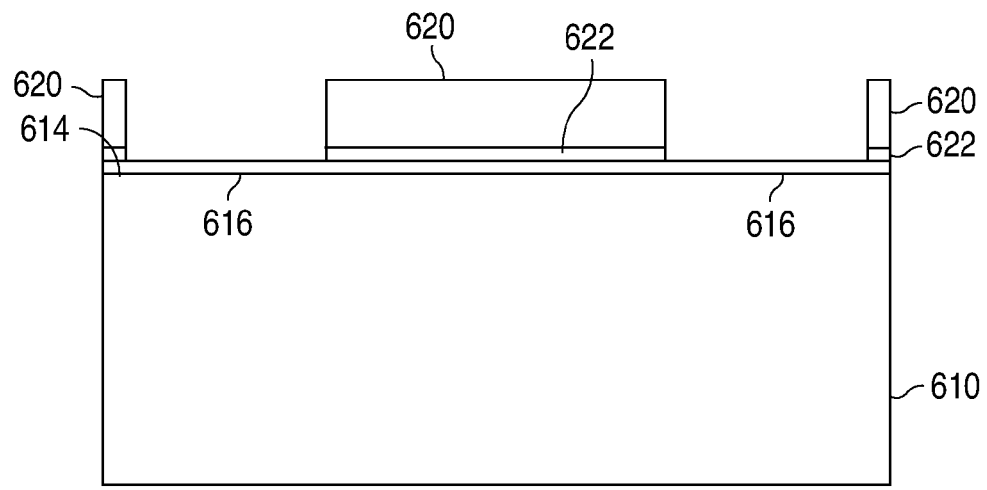
Figure 6C:
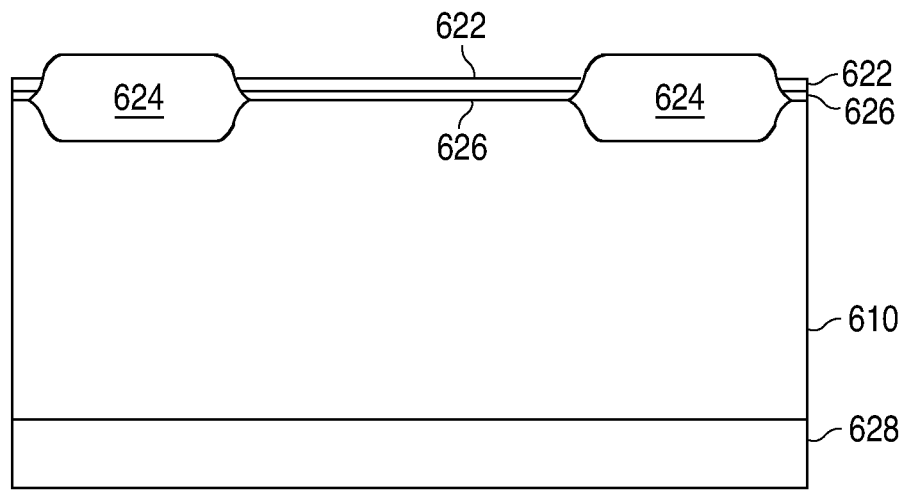
Figure 6D:
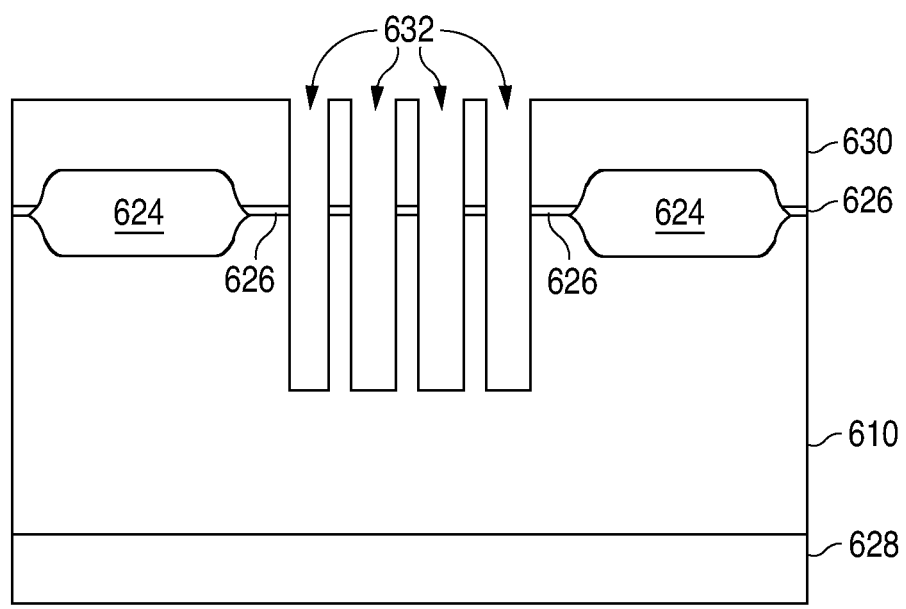
Figure 6E:
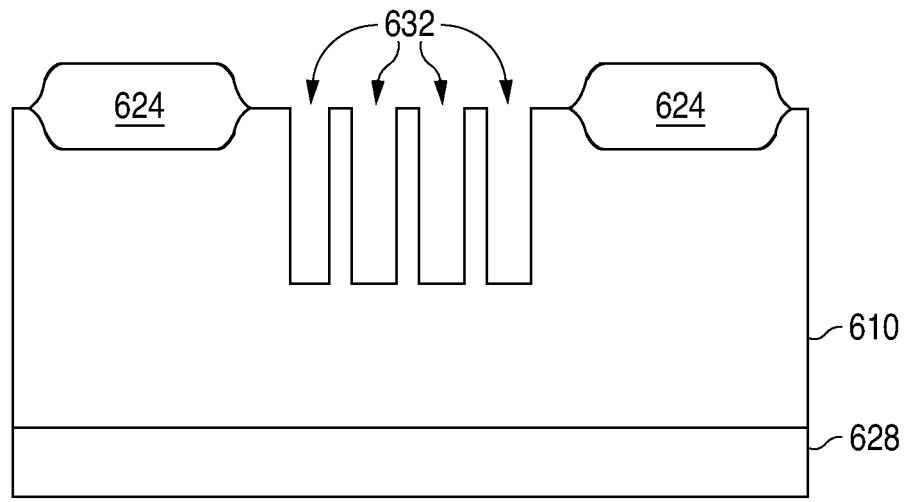
Figure 6F:
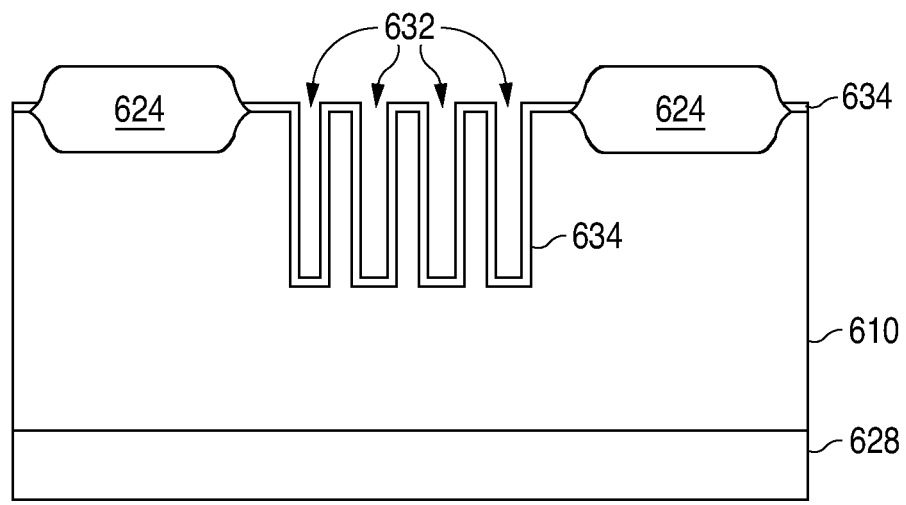
Figure 6G:
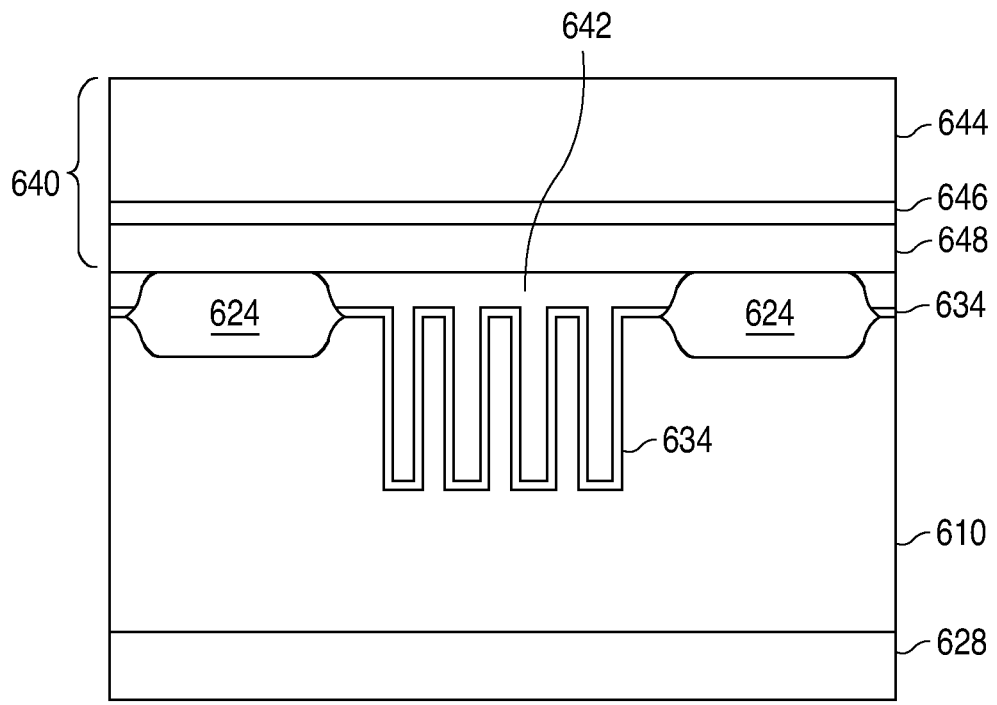
Figure 6H:
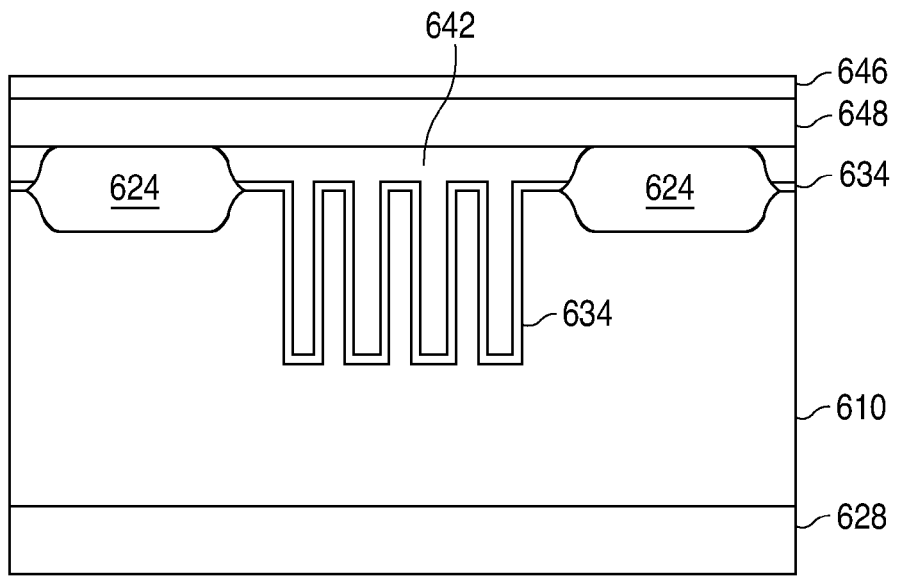
Figure 6I:
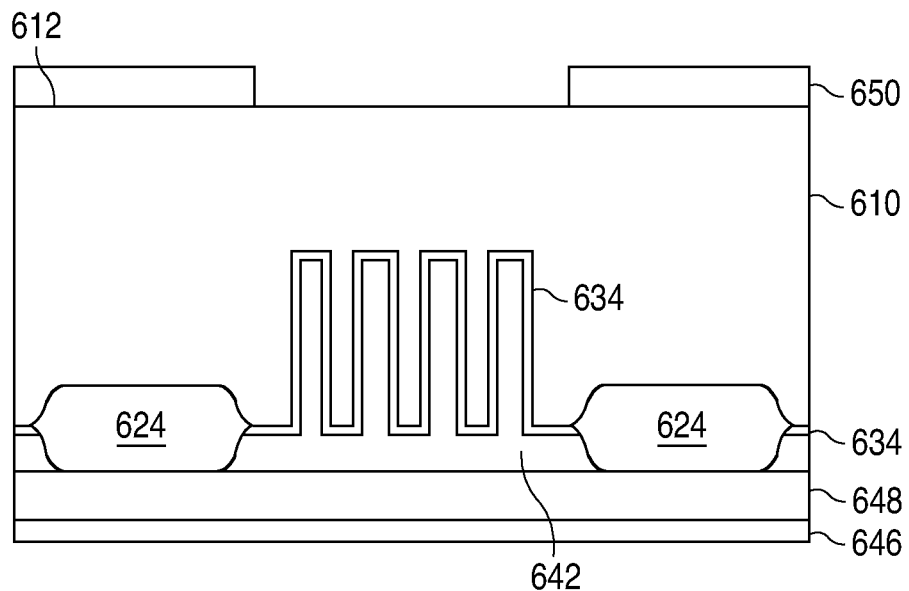
Figure 6J:
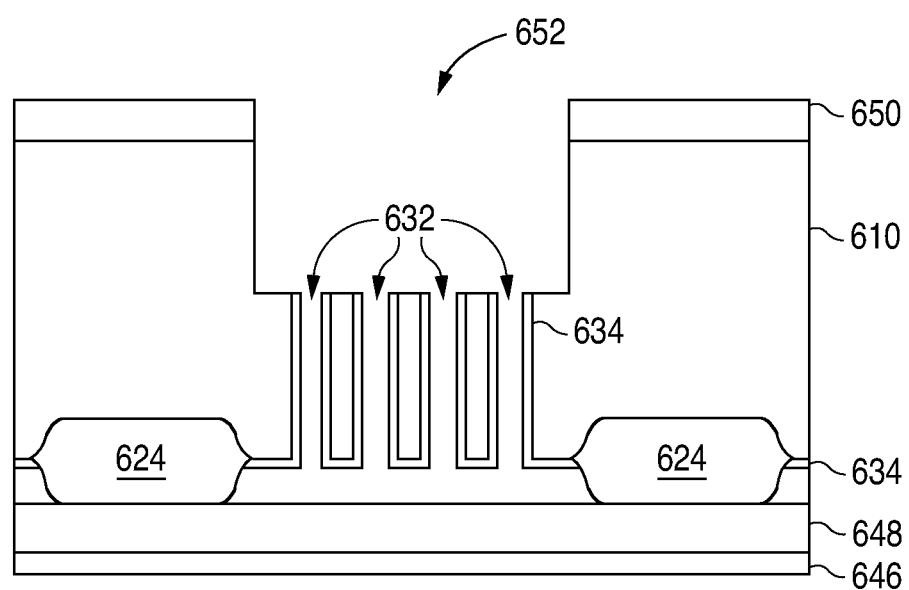
Figure 6K:
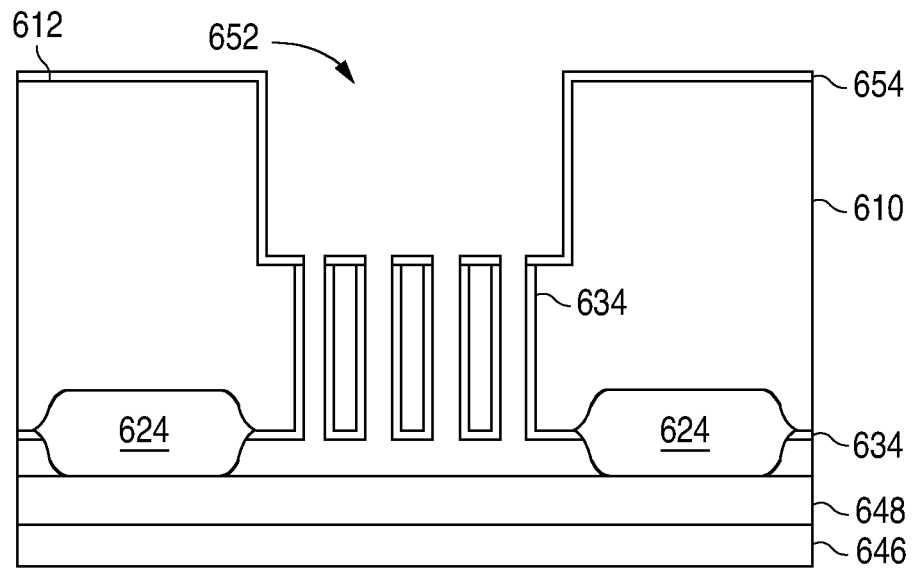
Figure 6L:
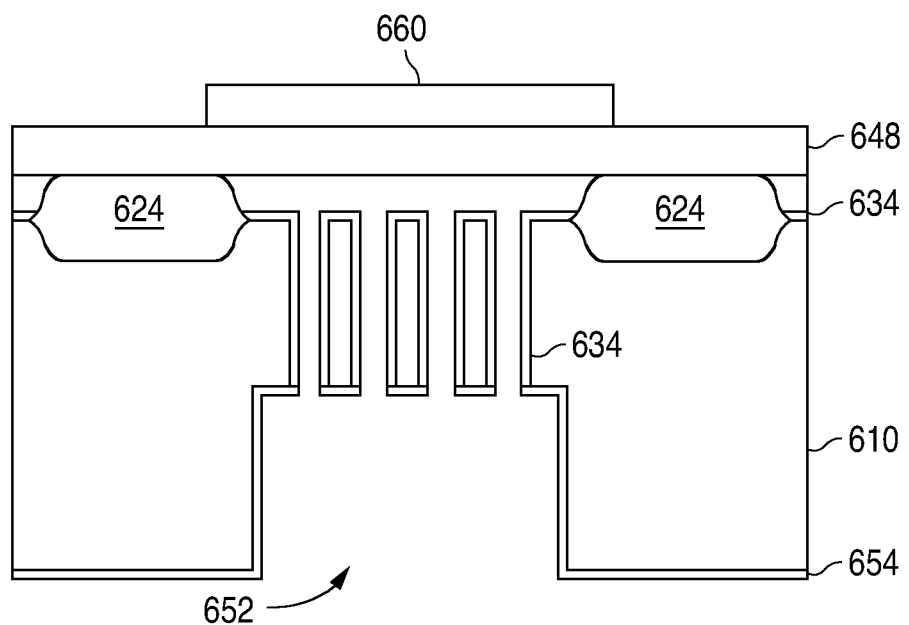
Figure 6M:
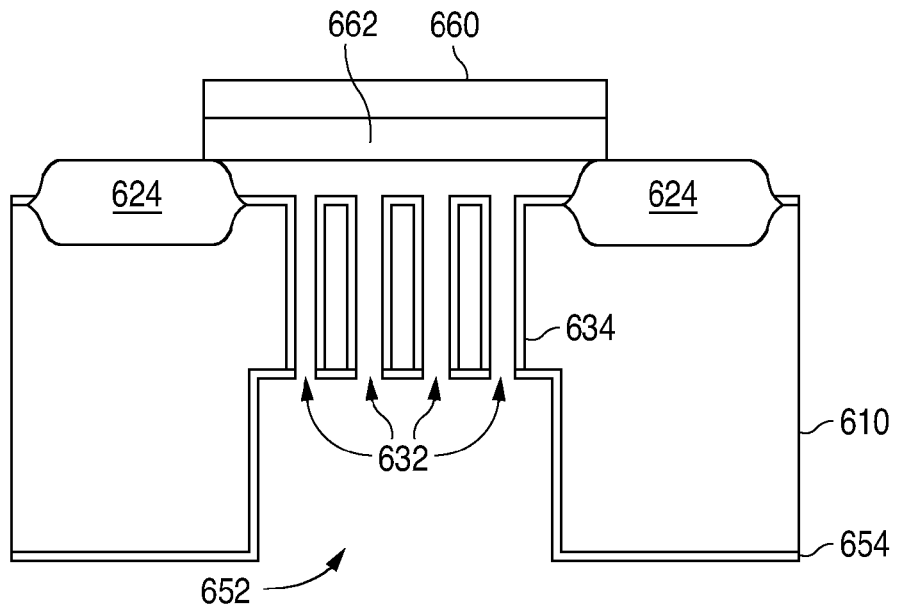
Figure 6N:
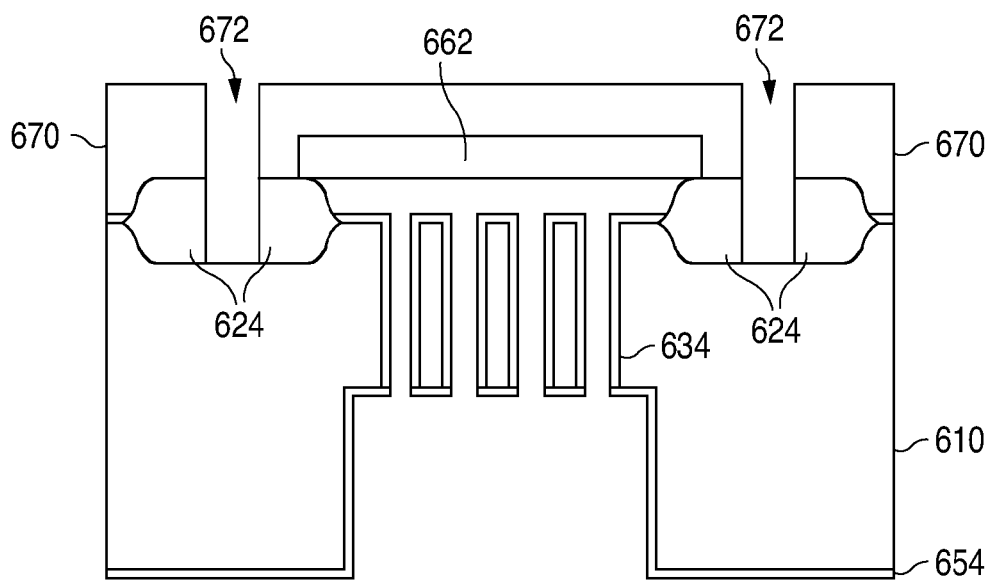
Figure 6O:
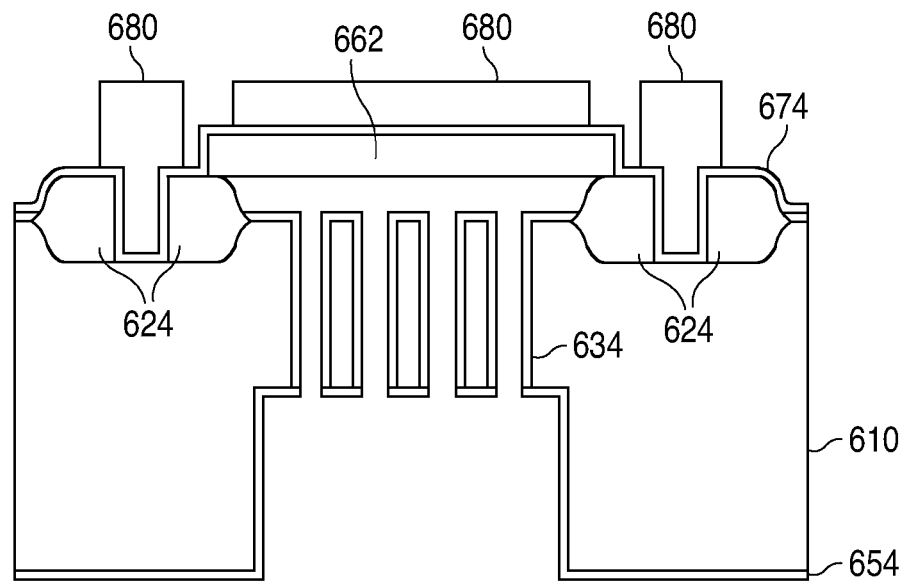
Figure 6P:
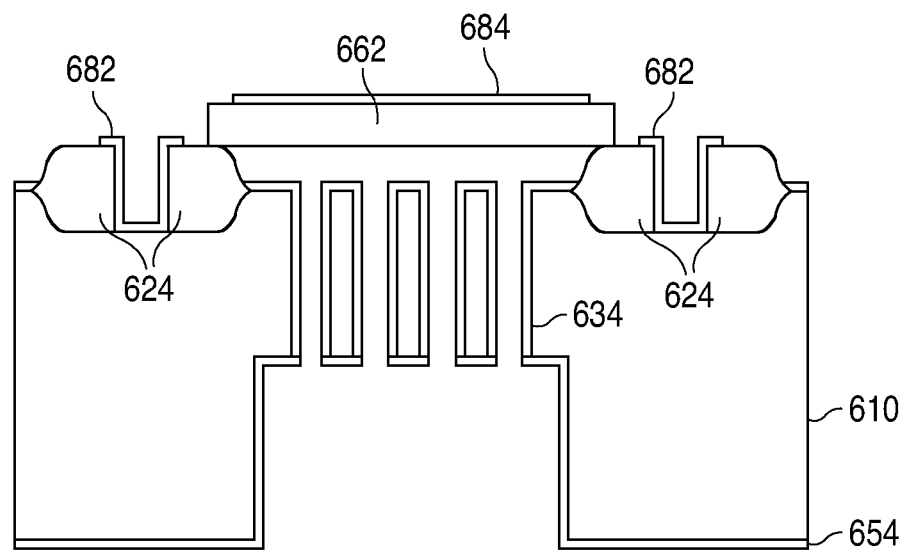
Figure 6Q:
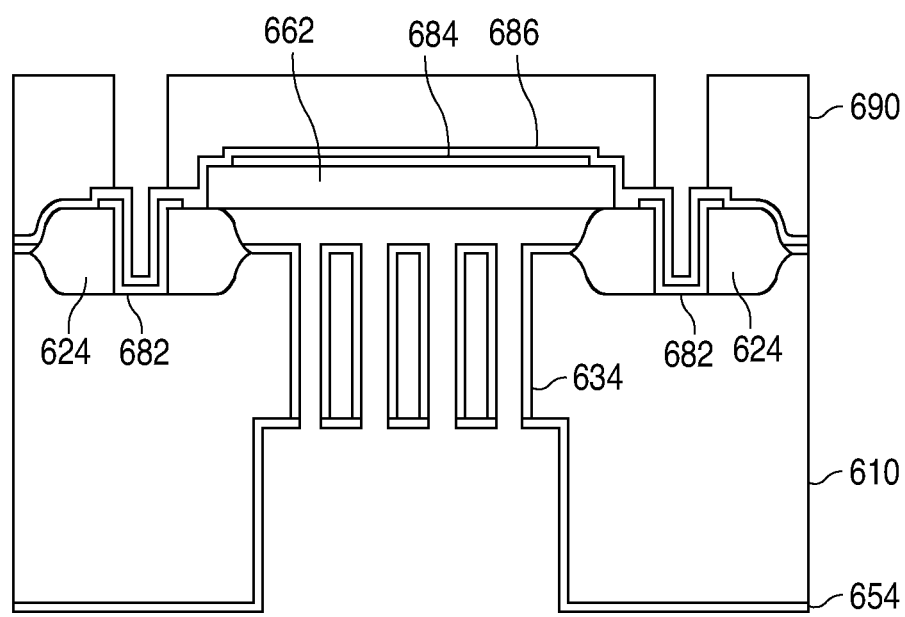
Figure 6R:
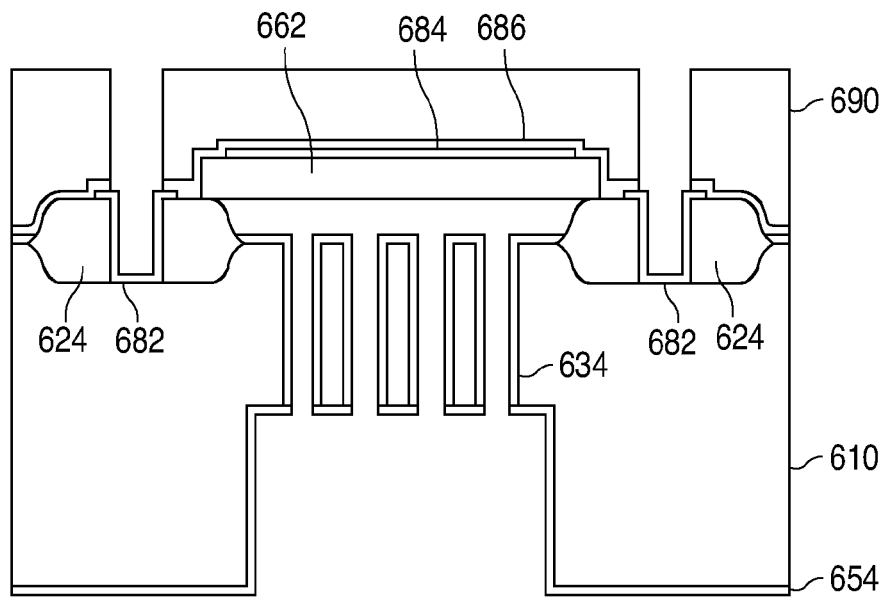
Figure 6S:
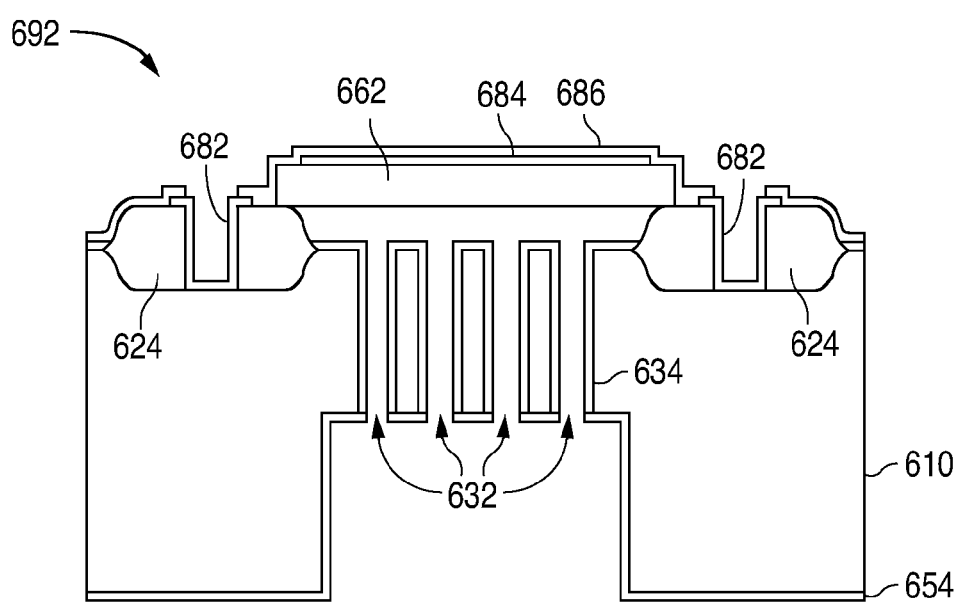

FIGS. 6A-6S show cross-sectional views that illustrate an example of a method of forming a CMUT in accordance with the present invention. As shown in FIG. 6A, the method utilizes a conventionally-formed single-crystal silicon wafer 610 that has a bottom surface 612 and a top surface 614, where the top surface 614 lies in a plane 615. In the present example, silicon wafer 610 has a low resistivity (e.g., 0.1 Ω-cm). Silicon wafer 610 has rows and columns of die-sized regions, and one or more CMUTS can be simultaneously formed in each die-sized region. For simplicity, FIGS. 6A-6S illustrate the formation of a single CMUT.

The method begins by forming a patterned photoresist layer on the top surface 614 of silicon wafer 610 in a conventional manner. After the patterned photoresist layer has been formed, the top surface 614 of silicon wafer 610 is etched for a predefined time to form two or more front side alignment marks.

If a wet etchant is used, the resulting structure is rinsed following the etch. After the rinse, the patterned photoresist layer is conventionally removed, such as with acetone. Following the removal of the patterned photoresist layer, the resulting structure is cleaned to remove organics, such as with a Piranha etch (e.g., using a solution of 50 $H_2SO_4$:1 $H_2O_2$ @ 120° C. removes approximately 240 nm/minute).

Next, the method continues by forming a post oxide structure on the top surface 614 of silicon wafer 610. The post oxide structure, which is non-conductive, is formed using the well-known local oxidation of silicon (LOCOS) process. As illustrated in FIG. 6A, he LOCOS process begins by forming a pad oxide layer 616 on the top surface 614 of silicon wafer 610, followed by the formation of a nitride layer 618 on the top surface of pad oxide layer 616. Pad oxide layer 616 can have a thickness of, for example, 250 Å, while nitride layer 618 can have a thickness of, for example, 1500 Å. After this, a patterned photoresist layer 620 is formed on nitride layer 618 in a conventional manner.

Following the formation of patterned photoresist layer 620, as shown in FIG. 6B, the exposed region of nitride layer 618 is plasma etched to expose a region of pad oxide layer 616. In addition, the etch leaves nitride regions 622. After this, patterned photoresist layer 620 is conventionally removed, such as with acetone. The resulting structure is then cleaned to remove organics, such as with a Piranha etch, followed by a conventional pre-oxidization clean. (The cleaning and pre-oxidization cleans can be sequentially performed with the same etchant.)

Next, as shown in FIG. 6C, the resulting structure is oxidized in a steam of, for example, 1100° C. for 18 hours, to grow the exposed region of pad oxide layer 616 to form a post oxide structure 624. The growth also leaves pad oxide regions 626 that lie below the nitride regions 622, as well as forming a backside oxide structure 628. In the present example, post oxide structure 624 and bottom side oxide structure are both grown to have a total thickness of, for example, 3 μm which, in turn, gives post oxide structure 624 a height above the top surface 614 of silicon wafer 610 of 1.5 μm.

The top surface of post oxide structure 624 is substantially planar. In addition, the surface roughness of post oxide structure 624 must be controlled to provide a good bonding surface. In the present example, the surface roughness must be less than 3 Å RMS. Further, laterally adjacent sections of post oxide structure 624, which are substantially defined by the dimensions of the intermediate nitride region 622, are spaced apart by, for example, 0.5 mm. Following the formation of post oxide structure 624, the nitride regions 622 are removed in a conventional manner.

As shown in FIG. 6D, after the nitride regions 622 have been removed, a patterned photoresist layer 630 is formed on post oxide structure 624 and the pad oxide regions 626 in a conventional manner.

Next, the exposed regions of the pad oxide region 626 and the underlying regions of silicon wafer 610 that lie between post oxide structure 624 are dry etched for a predefined time to form a number of vent holes 632.

For example, the well-known Bosch etch process can be used to form the vent holes 632 to have a diameter of, for example, 50 µm, and substantially vertical side walls that extend down to a depth of, for example, 400 µm (to have an aspect ratio of 8:1). Although described as circular in the present example, the vent holes 632 can have any shape or combination of shapes, depending on the mask used to form patterned photoresist layer 630.

As shown in FIG. 6E, after the vent holes 632 have been formed, patterned photoresist layer 630 is conventionally removed, such as with acetone. Following this, the resulting structure is cleaned to remove organics, such as with a Piranha etch. The pad oxide regions 626 are then removed without damaging the top surface of silicon wafer 610. For example, the pad oxide regions 626 can be removed using, for example, a wet etchant that is highly or completely selective to silicon. After this, the resulting structure is rinsed, and then subjected to a conventional pre-oxidization clean.

As shown in FIG. 6F, following the removal of the pad oxide regions 626, a cell oxide layer 634 is grown on the top surface 614 of silicon wafer 610. Cell oxide layer 634, which has a thickness of, for example, 2500 Å, also lines the side wall and bottom surfaces of the vent holes 632, which in the present example have diameters of 50 µm.

After cell oxide layer 634 has been formed, as shown in FIG. 6G, a silicon-on-oxide (SOI) wafer 640 is bonded to the top surface of post oxide structure 624 to form a cavity 642. In the present example, SOI wafer 640 is vacuum fusion bonded to post oxide structure 624 of silicon wafer 610 in a conventional manner so that cavity 642 has a vacuum, followed by an anneal to ensure reliable bonding strength. The anneal can be performed with a temperature in the range of 400° C. to 1050° C. In the present example, the anneal is performed at 1050° C. immediately after the bonding for approximately four hours. Alternately, other bonding approaches can also be used.

SOI wafer 640 has a handle wafer 644, an insulation layer 646 that touches handle wafer 644, and a single-crystal silicon substrate structure 648. Substrate structure 648, in turn, has a first substantially-planar surface that touches insulation layer 646, and a second substantially-planar surface that touches post oxide structure 624. In the present example, insulation layer 646 has a thickness of 1.1 µm, and substrate structure 648 has a thickness of 2.2 µm.

As shown in FIG. 6H, after substrate structure 648 has been bonded to post oxide structure 624, handle wafer 644 is removed in a conventional manner. For example, handle wafer 644 can be removed by grinding handle wafer 644 down to a thickness of approximately 150 µm, and then wet etching the remainder away in a solution of KOH.

As shown in FIG. 6I, after handle wafer 644 has been removed, the resulting structure is flipped over for processing, and backside oxide structure 628 is removed in a conventional manner. For example, backside oxide structure 628 can be removed using chemical mechanical polishing. Alternately, bottom side oxide structure 628 can be removed using a single-sided wet etch, such as a SEZ etch by SEZ Austria GmbH, Draubodenweg 29, A-9500 Villach, Austria. Following the removal of backside oxide structure 628, a patterned photoresist layer 650 is formed on the bottom surface 612 of silicon wafer 610 in a conventional manner.

Once patterned photoresist layer 650 has been formed, as shown in FIG. 6J, the exposed region of silicon wafer 610 is etched to form a backside opening 652 that exposes and opens the vent holes 632 that are laterally surrounded by post oxide structure 624, thereby breaking the vacuum in cavity 642. For example, the well-known Bosch etch process can be used to form backside opening 652 to have substantially vertical side walls that extend down to a depth of, for example, 350 µm or more.

As shown in FIG. 6K, after backside opening 652 has been formed, patterned photoresist layer 650 is conventionally removed, such as with acetone. Following the removal of patterned photoresist layer 650, the resulting structure is cleaned to remove organics, such as with a Piranha etch. In addition, a single-sided wet etch, such as a SEZ etch, can optionally follow to ensure that the vent holes 632 are open.

After this, a protective oxide layer 654 is grown on the bottom surface 612 of silicon wafer 610 to line backside opening 652 during an anneal in a conventional manner. The anneal can be performed with a temperature in the range of 400° C. to 1050° C. In the present example, the anneal is performed at 1050° C. for approximately four hours. Protective oxide layer 654 can be grown to have a thickness of, for example, 2500 Å. (The growth of protective oxide layer 654 also increases the thickness of cell oxide layer 634 by a similar amount.)

After protective oxide layer 654 has been formed, as shown in FIG. 6L, the resulting structure is flipped and insulation layer 646 is removed in a conventional manner. For example, insulation layer 646 can be removed using chemical mechanical polishing. Alternately, insulation layer 646 can be removed using a single-sided wet etch, such as a SEZ etch. Following the removal of insulation layer 646, a patterned photoresist layer 660 is formed on the first surface of substrate structure 648 in a conventional manner.

Once patterned photoresist layer 660 has been formed, as shown in FIG. 6M, the exposed regions of substrate structure 648 are etched to form a CMUT membrane 662 that lies directly vertically over the vent holes 632. In addition, the etch also exposes the alignment marks. If a wet etchant is used, the resulting structure is rinsed following the etch. After the rinse, patterned photoresist layer 660 is conventionally removed, such as with acetone. Following the removal of patterned photoresist layer 660, the resulting structure is cleaned to remove organics, such as with a Piranha etch.

As shown in FIG. 6N, after the cleaning following the removal of patterned photoresist layer 660, a patterned photoresist layer 670 is formed on post oxide structure 624 and CMUT membrane 662 in a conventional manner. Once patterned photoresist layer 670 has been formed, the exposed regions of post oxide structure 624 are etched to form openings 672 that expose silicon wafer 610.

In the present example, the openings 672 each has a diameter of 50 µm. If a wet etchant is used, the resulting structure is rinsed following the etch. After the rinse, patterned photoresist layer 670 is conventionally removed, such as with acetone. Following the removal of patterned photoresist layer 670, the resulting structure is cleaned to remove organics, such as with a Piranha etch.

After cleaning following the removal of patterned photoresist layer 670, as shown in FIG. 6O, a metal layer 674, such as a layer of aluminum copper, is deposited to touch silicon wafer 610, post oxide structure 624, and CMUT membrane 662. In the present example, metal layer 674 is formed to have a thickness of 1 µm. Next, a patterned photoresist layer 680 is formed on metal layer 674 in a conventional manner.

As shown in FIG. 6P, after patterned photoresist layer 680 has been formed, the exposed region of metal layer 674 is wet etched to form semiconductor bond pads 682 that each extends through post oxide structure 624 to touch silicon wafer 610, and a metal plate 684 that touches the top surface of CMUT membrane 662. Following the etch, the resulting structure is rinsed. After the rinse, patterned photoresist layer 680 is conventionally removed, such as with acetone.

After the removal of patterned photoresist layer 680, as shown in FIG. 6Q, a passivation layer 686, such as a layer of plasma oxide approximately 0.6 µm thick and an overlying layer of plasma nitride approximately 0.6 µm thick, is deposited on post oxide structure 624, CMUT membrane 662, the bond pad structures 682, and metal plate 684. Next, a patterned photoresist layer 690 is formed on passivation layer 686 in a conventional manner.

As shown in FIG. 6R, after patterned photoresist layer 690 has been formed, the exposed regions of passivation layer 686 are wet etched to form openings that expose the bond pad structures 682, and an opening, like opening 446 shown in FIG. 4A, that exposes a bond pad region on metal plate 684. Following the etch, the resulting structure is rinsed.

After the rinse, as shown in FIG. 6S, patterned photoresist layer 690 is conventionally removed, such as with acetone. After the removal of patterned photoresist layer 690, the resulting structure is alloyed at, for example, 400° C. in a ambient of $N_2+H_2$ to form a CMUT 692.

One of the advantages of CMUT 692 is that the vent holes 632 allow a low-frequency CMUT to be formed in a process that includes a conventional LOCOS process to form post oxide structure 624. In addition, the vent holes 632 are exposed to the atmosphere and, thus, experience no degradation due to altitude. (The accuracy of large vacuum sealed cavities degrades with altitude.)

Figure 7A:
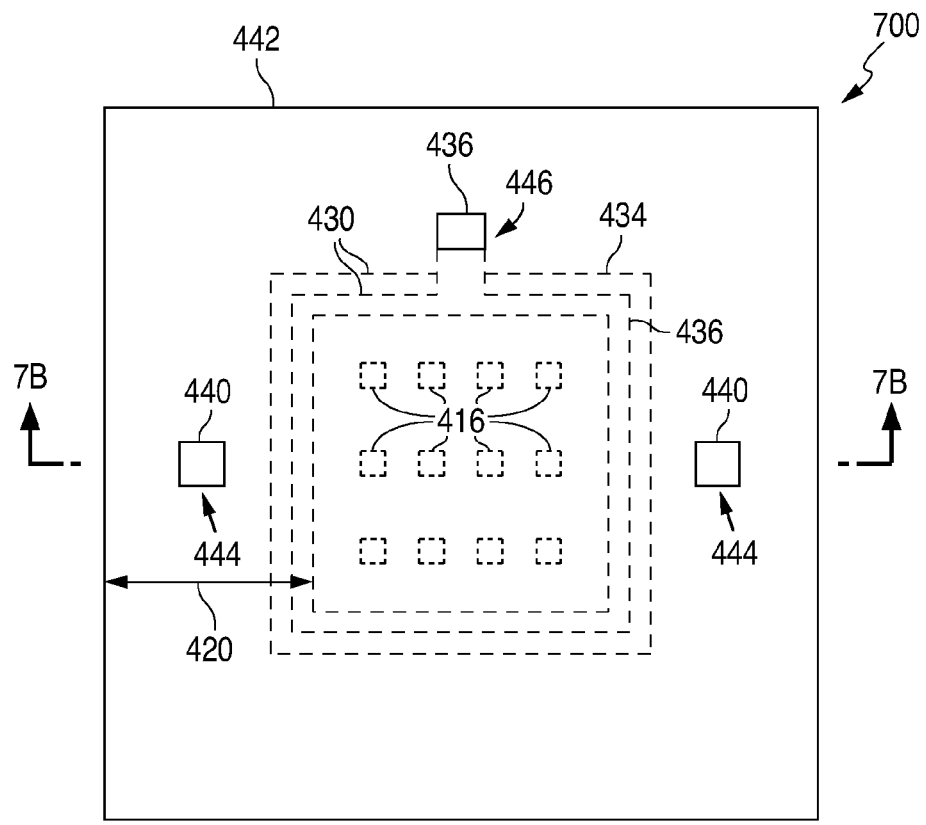
FIGS. 7A-7B are views illustrating an example of a CMUT 700 in accordance with an alternate embodiment of the present invention.
Figure 7B:
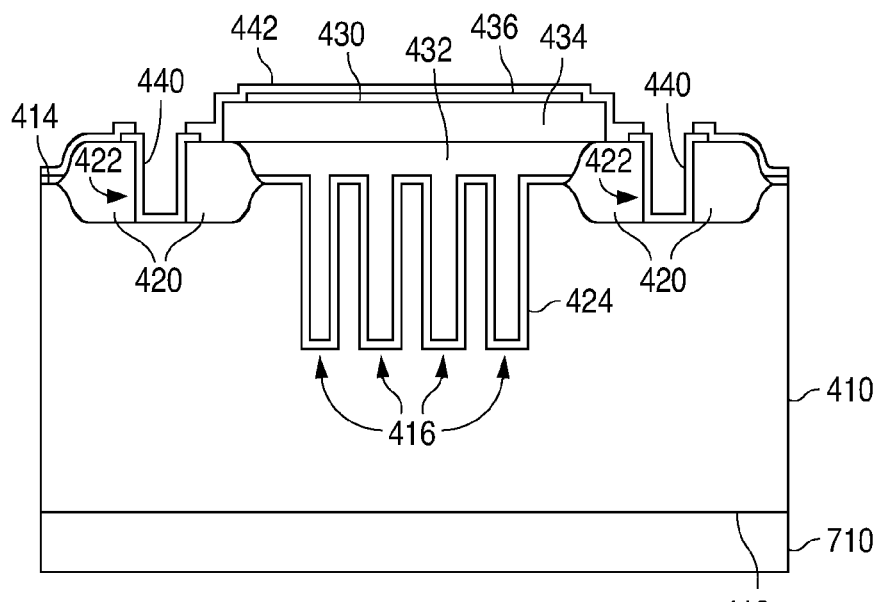

FIGS. 7A-7B show views that illustrate an example of a CMUT 700 in accordance with an alternate embodiment of the present invention. FIG. 7A shows a plan view of CMUT 700. FIG. 7B shows a cross-sectional view taken along line 7B-7B of FIG. 7A. CMUT 700 is similar to CMUT 400 and, as a result, utilizes the same reference numerals to designate the elements which are common to both CMUTS.

As shown in FIGS. 7A-7B, CMUT 700 differs from CMUT 400 in that CMUT 700 omits the steps required to form backside opening 418 and non-conductive structure 426 (but includes the second four hour anneal before insulation layer 646 is removed). As a result, each vent hole 416 has a bottom surface that lies above and vertically spaced apart from the bottom surface 412 of semiconductor substrate 410. Thus, a region of semiconductor substrate 410 touches and lies directly vertically between the bottom surface of each vent hole 416 and the bottom surface 412 of semiconductor substrate 410.

In addition, CMUT 700 includes a backside oxide structure 710 that touches the bottom side 412 of semiconductor substrate 410. Backside oxide structure 710, which can optionally be removed in the same manner that backside oxide structure 628 is removed, is formed automatically at the same time that post oxide structure 420 is formed.

Further, conductive structure 430 can be vacuum fusion bonded at less than a complete vacuum, for example, 75% atmospheric pressure. Bonding at a partial atmospheric pressure reduces the deflection of CMUT membrane 434, and enables the continued use of the LOCOS thermal oxidation process to form a CMUT cell. CMUT 700 operates the same as CMUT 400.

One advantage of CMUT 700 is that the vent holes 416 substantially increase the effective volume of cavity 432. Increasing the effective volume without increasing the distance between the two capacitor plates has the positive effect of greatly reducing squeeze film damping, which is the loss of accuracy due to the compression of air within the cavity. The volume of the vent holes 416 could increase the effective cavity volume by a factor of 100×. In addition to increased volume, the effect of squeeze film dampening is also a function of the vent hole depth, the vent hole shape, and the vent hole location.

Another of the advantages of CMUT 700 is that since the vent holes 416 remain closed and under a partial vacuum, no contaminants or foreign objects can become undesirably lodged in the vent holes 416. Further, the costs associated with the backside processing (the mask and etch) are also eliminated.

Figure 8A:
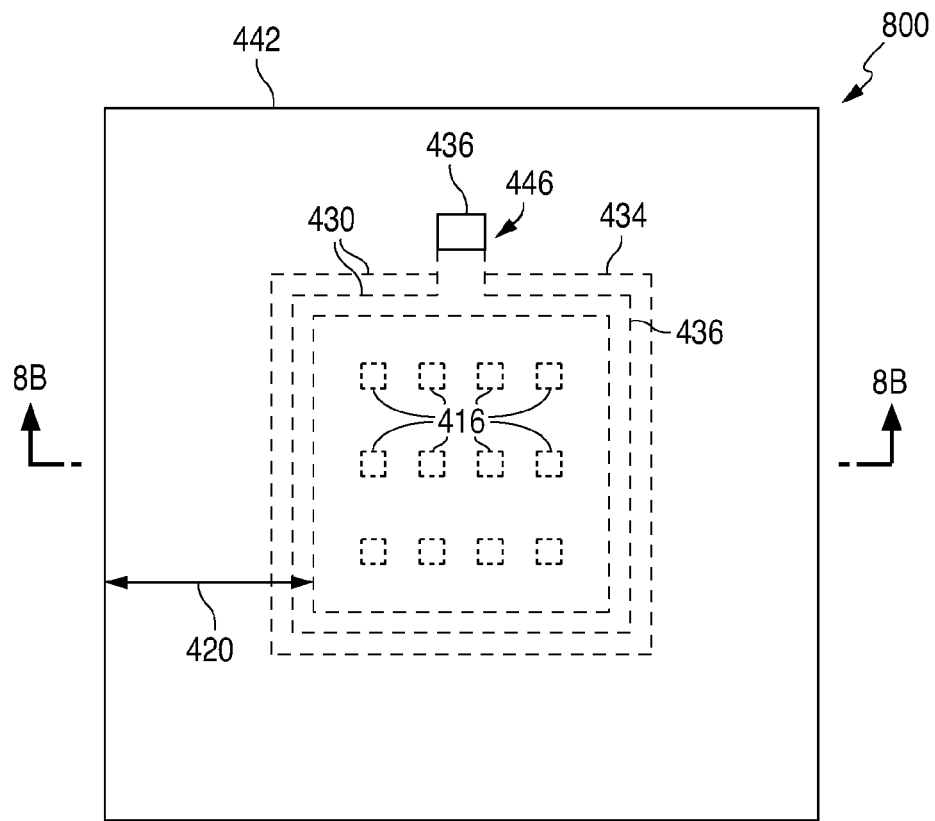
FIGS. 8A-8B are views illustrating an example of a CMUT 800 in accordance with an alternate embodiment of the present invention.
Figure 8B:
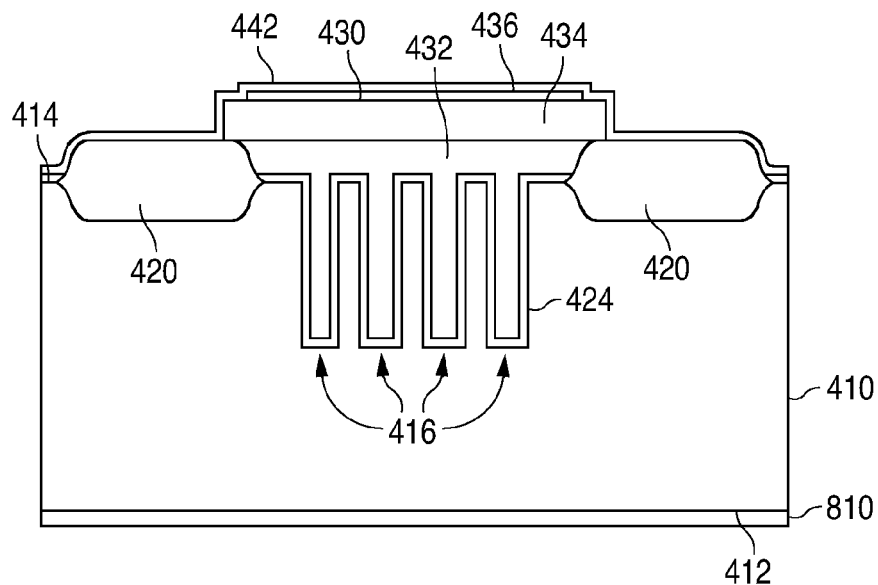

FIGS. 8A-8B show views that illustrate an example of a CMUT 800 in accordance with an alternate embodiment of the present invention. FIG. 8A shows a plan view of CMUT 800. FIG. 8B shows a cross-sectional view taken along line 8B-8B of FIG. 8A. CMUT 800 is similar to CMUT 700 and, as a result, utilizes the same reference numerals to designate the elements which are common to both CMUTS.

As shown in FIGS. 8A-8B, CMUT 800 differs from CMUT 700 in that CMUT 800 omits the substrate contact openings 422 and the substrate bond pads 440 that lie within the substrate contact openings 422. As a result, no conductive structure extends through post oxide structure 420 in the FIGS. 8A-8B example.

In addition, CMUT 800 includes a backside bond pad structure 810 that touches the bottom side 412 of semiconductor substrate 410. Backside bond pad structure 810 can be formed by removing backside oxide structure 710 of CMUT 800 in the same manner that backside oxide structure 628 is removed. Following this, a metal layer, such as 100 Å of titanium and 1 µm of aluminum copper, is deposited onto the bottom surface 412 of semiconductor substrate 410. The metal layer can also be implemented with other common back side metallization stacks, such as TiNiAg, TiNiAu, CRAu, or TiAu. CMUT 800 otherwise operates the same as CMUT 700. One of the advantages of CMUT 800, in addition to the advantages of CMUT 700, is that CMUT 800 eliminates the costs associated with forming the substrate contact openings 422.

Figure 9A:
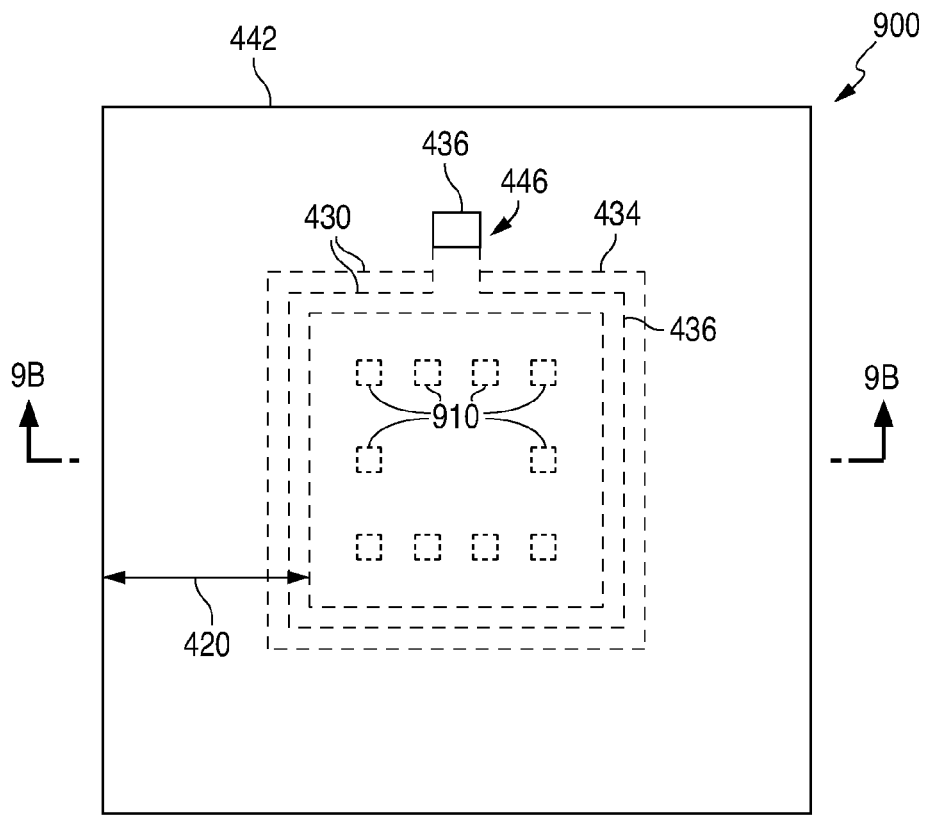
FIGS. 9A-9B are views illustrating an example of a CMUT 900 in accordance with an alternate embodiment of the present invention.
Figure 9B:
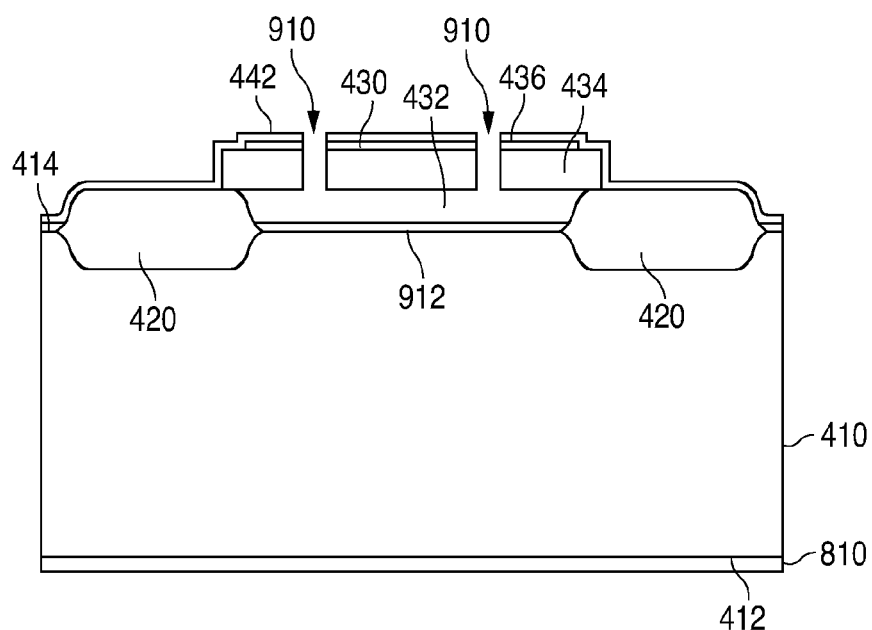

FIGS. 9A-9B show views that illustrate an example of a CMUT 900 in accordance with an alternate embodiment of the present invention. FIG. 9A shows a plan view of CMUT 900. FIG. 9B shows a cross-sectional view taken along line 9B-9B of FIG. 9A. CMUT 900 is similar to CMUT 800 and, as a result, utilizes the same reference numerals to designate the elements which are common to both CMUTS.

As shown in FIGS. 9A-9B, CMUT 900 differs from CMUT 800 in that CMUT 900 omits the vents holes 416, but instead utilizes peripheral vent holes 910 in conductive structure 430 and passivation layer 442 to vent cavity 432. In addition, CMUT 900 utilizes a non-conductive structure 912, which only touches the top surface 414 of semiconductor substrate 410, in lieu of non-conductive structure 424.

The vent holes 910 can be formed prior to the formation of passivation layer 686 by forming a patterned photoresist layer on metal plate 684, followed by an etch through metal plate 684 and CMUT membrane 662. The patterned photoresist layer is then removed, followed by the formation of passivation layer 686.

During the formation of passivation layer 686, small amounts of passivation layer 686 will be deposited on the top surface of non-conductive structure 912. However, because the vent holes 910 are peripheral, the small amounts of passivation layer 686 on the top surface of non-conductive structure 912 do not prevent CMUT 900 from vibrating the same as CMUT 800, except that air flows through the peripheral vent holes 910 as conductive structure 662 vibrates.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A semiconductor transducer comprising:
   a substrate having a bottom surface and a top surface and being conductive, the top surface lying in a plane;
   a post structure that touches the top surface of the substrate, the post structure having a top surface and being non-conductive, a portion of the post structure lying below the plane and a portion of the post structure lying above the plane;
   a non-conductive structure that touches the top surface of the substrate, the post structure laterally surrounding the non-conductive structure; and
   a conductive structure that touches the top surface of the post structure and lies directly vertically over the non-conductive structure to form a cavity, the conductive structure having a plurality of vent holes that extend completely through the conductive structure to expose the cavity.

2. The semiconductor transducer of claim 1 wherein the post structure laterally surrounds and touches the non-conductive structure.

3. The semiconductor transducer of claim 1 wherein the conductive structure includes:
   a single-crystal silicon structure; and
   a metal plate that touches the single-crystal silicon structure.

4. The semiconductor transducer of claim 1 and further comprising a metal bond pad structure that touches the bottom surface of the substrate.

5. The semiconductor transducer of claim 1 wherein no conductive structure extends through the post structure.

* * * * *